United States Patent [19]
Satou

[11] Patent Number: 5,930,607
[45] Date of Patent: Jul. 27, 1999

[54] METHOD TO PREVENT STATIC DESTRUCTION OF AN ACTIVE ELEMENT COMPRISED IN A LIQUID CRYSTAL DISPLAY DEVICE

[75] Inventor: Takashi Satou, Nagano-ken, Japan

[73] Assignee: Seiko Epson Corporation, Tokyo, Japan

[21] Appl. No.: 08/849,288

[22] PCT Filed: Oct. 2, 1996

[86] PCT No.: PCT/JP96/02858

§ 371 Date: May 30, 1997

§ 102(e) Date: May 30, 1997

[87] PCT Pub. No.: WO97/13177

PCT Pub. Date: Apr. 10, 1997

[30] Foreign Application Priority Data

Oct. 3, 1995 [JP] Japan .................................. 7-279587

[51] Int. Cl.⁶ .......................... H01L 21/336; H01L 29/78; G02F 1/13
[52] U.S. Cl. .............................. 438/158; 257/59; 257/72; 345/87; 345/90; 345/92; 349/40; 349/43
[58] Field of Search .................................. 257/57, 59, 72, 257/356; 438/149, 151, 158, 159; 345/87, 90, 92, 205; 349/40, 43, 54

[56] References Cited

U.S. PATENT DOCUMENTS

| | | |
|---|---|---|
| 4,778,258 | 10/1988 | Parks et al. . |
| 5,068,748 | 11/1991 | Ukai et al. . |
| 5,200,876 | 4/1993 | Takeda et al. . |
| 5,219,771 | 6/1993 | Miyake . |
| 5,373,377 | 12/1994 | Ogawa et al. . |
| 5,606,340 | 2/1997 | Suzuki et al. . |
| 5,671,026 | 9/1997 | Shiraki et al. . |

FOREIGN PATENT DOCUMENTS

| | | |
|---|---|---|
| A 62-187885 | 8/1987 | Japan . |
| U 63-33130 | 3/1988 | Japan . |
| A-3-296725 | 12/1991 | Japan . |
| A-5-27263 | 2/1993 | Japan . |
| A-5-333377 | 12/1993 | Japan . |
| A-6-148688 | 5/1994 | Japan . |
| A-6-186592 | 7/1994 | Japan . |
| A-7-244294 | 9/1995 | Japan . |

Primary Examiner—Charles Bowers
Assistant Examiner—Keith Christianson
Attorney, Agent, or Firm—Oliff & Berridge, PLC

[57] ABSTRACT

A liquid crystal display device which utilizes an active matrix substrate and its substrate, and which is provided with a novel method of manufacture which can reduce the manufacturing process of amorphous silicon thin film transistors of reverse stagger construction, and an electrostatic protection means which is created using this method of manufacture. In a thin film transistor manufacturing process, along with forming an aperture for connecting the contact hole and the external terminal in a manufacturing process for a thin film transistor, utilization is made of ITO film as the wiring. The electrostatic protection means is formed from a bi-directional diode (electrostatic protection element) which is composed utilizing an MOS transistor connected between the electrode (PAD) for connecting the external terminal, and the joint electric potential line. The electrostatic protection element is substantially a transistor, with great current capacity, and utilizing the TFT formation process of pixel components in their existent state, the process can be formed without any complications.

15 Claims, 25 Drawing Sheets

------ ; GATE ELECTRODE (FIRST LAYER)

—··— ; AMORPHOUS SILICON (SECOND LAYER)

—·— ; SOURCE ELECTRODE, DRAIN ELECTRODE, JOINT ELECTRIC POTENTIAL (LC-COM) ELECTRODE AND THE LIKE (THIRD LAYER)

——— ; ELECTRODE FORMED FROM ITO (LAYER 4)

☐ ; CONTACT HOLE FOR CONNECTING LAYER 3 AND LAYER 4

⊠ ; CONTACT HOLE FOR CONNECTING LAYER 1 AND LAYER 4

▨ ; TFT FORMATION REGION

▧ ; ELECTRODE AND WIRING UTILIZING LAYER 3

METHOD TO PREVENT STATIC DESTRUCTION OF AN ACTIVE ELEMENT COMPRISED IN A LIQUID CRYSTAL DISPLAY DEVICE

BACKGROUND OF THE INVENTION

1. Field of the Invention

The present invention relates to a method for manufacturing a thin film element, an active matrix substrate, a liquid crystal display device and an active matrix substrate, as well as a method for preventing the electrostatic destruction of an active element included in a liquid crystal display device.

2. Description of Related Art

With the liquid crystal display device having an active matrix format, the switching element in each pixel electrode is connected, and each pixel electrode is switched through the switching element. As the switching element, utilization may be made, for example, of a thin film transistor (TFT).

The construction and operation of the thin film transistor is fundamentally the same as the single crystal silicon MOS transistor.

As the structure of the thin film transistor which utilizes amorphous silicon (α-Si) there are a number of well known types of construction. However, bottom gate structure (reverse stagger structure) wherein the gate electrode is at the bottom of the amorphous silicon film is generally used.

In the structure of a thin film transistor, it is important to reduce the number of construction processes and to assure a high yield.

In addition, in the production process of an active matrix substrate, it is important to effectively protect the thin film transistor from the destruction caused by the generated static electricity. The technology for protecting the thin film transistor from electrostatic destruction is disclosed, for example, in Japanese laid open utility model 63-33130 which is recorded on microfilm, or in laid open patent publication 62-187885.

SUMMARY OF THE INVENTION

One of the objects of the present invention is to provide a novel thin film element production process technology which enables the reduction of the number of thin film transistor manufacturing processes, with a high degree of reliability.

In addition, another object of the present invention is to provide an active matrix substrate and a liquid crystal display device in which the production process is formed utilizing production process technology which is not complicated, and which has adequate electrostatic prevention capacity for the protection elements. In addition, another object of the present invention is to provide an electrostatic destruction prevention method which can prevent the electrostatic destruction of the active elements (TFT) included in the TFT substrate.

One of the desirable situations for the production method of thin film elements according to the present invention is that, at the time of producing the thin film elements having a bottom gate construction, it includes a process for forming a protective film which covers the source electrode, the drain electrode, and the gate electrode material layer. Subsequently a process for forming a first aperture component having a part of a built up film comprising a gate electrode layer is selectively etched. A gate insulation film which is present on a gate electrode material layer, and a protective film are also formed so that a portion of the surface of the gate electrode layer and the gate electrode material layer is exposed. At the same time, a second aperture component is formed wherein selected etching of a portion of the source electrode layer and the protective film on the drain electrode layer is accomplished, so as to expose a part of the source electrode layer and the surface of the drain electrode layer; and a process which subsequently connects at least one of the gate electrode layer, the gate electrode material layer, the source electrode layer, or the drain electrode layer with the electrically conductive material layer through the first and second aperture.

According to the described thin film element manufacturing method, selective etching of the insulation film is accomplished all at once. Hence, the formation process of an aperture to connect the external connection terminal to the electrode (pad open process), and the formation process of an aperture for connecting the internal wiring to the electrode (contact hole formation process) can be jointly accomplished, and the number of processes can be reduced.

As the "electrically conductive material layer", ITO (indium tin oxide) film is desirably utilized. As described above, the first aperture is formed so that it passes through the overlapped films comprising the first insulation film over the gate electrode material layer and the second insulation film over the first insulation film, a deep contact hole is created so as to correspond in depth of the two insulation films.

However, since ITO has a high melting point, ITO has good step coverage in comparison with aluminum, and the like, therefore the connection is not poor even if it is accomplished through a deep contact hole.

In addition to the ITO film, other transparent electrode materials which have a high melting point, such as metallic oxides can also be utilized as the "electrically conductive material layer". For example, metallic oxides such as SnOx and ZnOx may be utilized. In this case as well, the step coverage is able to withstand actual use.

In addition, with one desirable situation for an active matrix substrate according to the present invention, a protective means used to prevent the electrostatic destruction used with thin film transistors is connected between at least one line between the scanning line and the signal line, or between an electrically equivalent region to said line and a joint electric potential line.

The protective means used to prevent electrostatic destruction is composed to include a diode which is constructed so as to connect the gate electrode layer in the thin film transistor and the drain electrode layer, and by selectively removing the insulation layer from the gate electrode layer to electrically connect the drain electrode and the gate electrode, and by selectively removing the resultant first aperture component and the insulation from the drained electrode layer. The resultant second aperture component is formed by the same manufacturing process; and furthermore, the gate electrode layer and the drain electrode layer are connected by the electrically conducted layer formed from the same material as the pixel electrodes, through the first and second apertures.

Short circuiting the TFT gate and drain, the formed MOS diode (MIS diode) comprises a substantive transistor, in which there is a high capacity for the flow of electric current, and the static electricity can be quickly absorbed, with high static electricity protection capacity. In addition, since it is substantially a transistor, the control of the electric current/voltage characteristic threshold value voltage ($V_{th}$) can be easily accomplished. Furthermore, it is possible to reduce the unnecessary leakage of electric current. In addition, the number of manufacturing processes of the thin film element is reduced, and construction is simplified. As the "pixel electrode" and the "electrically conductive layer formed from the same material as the pixel electrode", desirable utilization is made of ITO (indium tin oxide) film. Other than the ITO film, utilization may also be made of other transparent electrode materials having a high melting point, such as metallic oxides. For example, use may be made of such metallic oxides as SnOx, and ZnOx and the like.

With one desirable situation for the active matrix substrate according to the present invention, the described "line which has at least one of either a scanning line or a signal line, and electrically equivalent regions" comprises an electrode (pad) for connecting an external connection element, and the "joint electric potential line" with a line (LC-COM line) to which is applied a standard electric potential which becomes the standard at the time of the alternating current driving of the liquid crystals, or with the manufacturing stage of the liquid crystal display device, it comprises a line (guard ring) for jointly connecting the electrode (pad) for connecting the external connection element and making it the same electric potential.

The guard ring is a line connected to the exterior of the pad, and serves as a counter measure for static electricity in the manufacturing stage of the liquid crystal display device. Both the LC-COM line and the guard ring are joint electric potential lines. Furthermore, by connecting a protective diode between the pad and these lines, static electricity can be avoided in the lines.

In addition, one of the desirable situations for an active matrix substrate according to the present invention is that the "protection means used to prevent static electricity destruction" is attached both between the electrode (pad) for connecting an outside terminal and the line (LC-COM line) to which has been applied the standard electric potential which became the standard at the time of alternate current driving of the liquid crystal; as well as between the electrode (pad) for connecting the external terminal and the line (guard ring) for jointly connecting the electrode (pad) for connecting the external terminal and making it the same electric potential.

The guard ring, following the emulation between the TFT substrate and the facing substrate (color filter substrate) is completely cut off prior to the connection of the IC used for the drive, and the LC-COM line is the line which remains in the final product. Furthermore, even after the substrate cutoff prior to the connection of the IC, according to the construction described above, the pixel TFT is protected from electrostatic destruction, and continuing, there is an improvement in the reliability of the product.

In addition, since the protective diode remains even in the final product, there is also an improvement in the strength of the protection against electrostatic destruction at the time of the product's actual use.

Furthermore, since it is a protective diode which uses the TFT, control of the threshold value voltage ($V_{th}$) can be easily accomplished, and since the current leakage can also be reduced, there is no negative influence even if the diode remains in the final product.

In addition, with one desirable situation for a method of manufacturing an active matrix substrate according to the present invention, the electrostatic destruction prevention protection means provides a bi-directional diode which jointly connects the first diode anode and the second diode cathode, and jointly connects the first diode cathode and the second diode anode.

Since it is a bi-direction protective diode, the TFT can be protected from both the positive electrode surge and negative electrode surge.

In addition, the liquid crystal display device is constructed using the active matrix substrate of the present invention. By assuredly preventing electrostatic destruction of the active element (TFT) of the pixels in the active matrix substrate, the reliability of the liquid crystal display device is also improved. In addition, with one desirable situation of a method of manufacturing an active matrix substrate according to the present invention at the time of forming the TFT of the bottom gate construction, in a specified region on the insulation film, at the same time as forming a source/drain electrode layer from the same materials, it includes a process for forming the source/drain electrode material layer from the same material as the source/drain electrode layer; and a process for creating a protective film which covers the source/drain electrode layer, and the source/drain electrode layer material; and a process for forming a second aperture so as to expose a part of the surface of the source/drain electrode layer or the source/drain electrode material layer, selectively etching the protective film on the source/drain electrode layer or the source/drain electrode material layer, at the same time as forming a first aperture so as to expose a part of the surface of the gate electrode layer and the gate electrode material layer, selectively etching the film buildup of the gate insulation film which exists on the gate electrode layer and the gate electrode material layer, as well as the protective film; and a process for connecting the electrically conductive material layer to the gate electrode layer, the gate electrode material layer, the source/drain electrode layer, or the source/drain electrode material layer, through the first and second apertures.

According to the described method of manufacture of the thin film element, selective etching of the insulation film is accomplished all at once. Hence, the formation process (pad open process) of the aperture for connecting the external terminal to the pad, and the formation process (contact hole formation process) of the aperture for connecting the wiring to the electrodes are jointly accomplished, thereby reducing the number of processes.

This method of manufacturing can also be used in the formation of the MOS diode as the static electricity protection element. In addition, utilization may also be made in the formation of the crossunder wiring in the vicinity of the pad. The "crossunder wiring" at the time of leading the internal wiring of the liquid crystal display device to the outside of the seal material achieves the protection of the wiring by means of a thick layer of insulating film between them connecting the wiring in the upper layer to the wiring of the lower layer with the wiring being used to lead to the outside in a round about manner.

The "conducted material layer" is desirably the same material as the pixel electrode. By this means, the wiring which is formed of the electrically conductive material is capable of being formed at the same time as the process for forming the pixel electrodes.

Furthermore, desirable use is made of ITO (indium tin oxide) film as the "electrically conductive material layer". Other than ITO film, use may also be made of other transparent electrode materials, having a high melting point such as metallic oxides.

In addition, as a preferable situation for an electrostatic destruction prevention method in the active matrix liquid crystal display device according to the present invention, a protective means used for electrostatic destruction prevention formed from a bi-directional diode is attached between at least one of either the scanning line or the signal line, or a region which is electrically equivalent to the line and a joint electric potential line, by which means prevention can be accomplished of electrostatic destruction of an active element included in the liquid crystal display device.

The electrostatic destruction of the active element (TFT) included in the active matrix substrate can be assuredly prevented.

DETAILED DESCRIPTION OF PREFERRED EMBODIMENTS

An explanation is provided hereafter of the form of the execution of the present invention, with reference to the drawings.

First Embodiment

FIGS. 1–6 are cross-sectional diagrams of the device following each process which show an example of the construction method of the thin film element (bottom gate construction TFT) of the present invention.

Contents of each manufacturing process

Process 1

Figure 1:
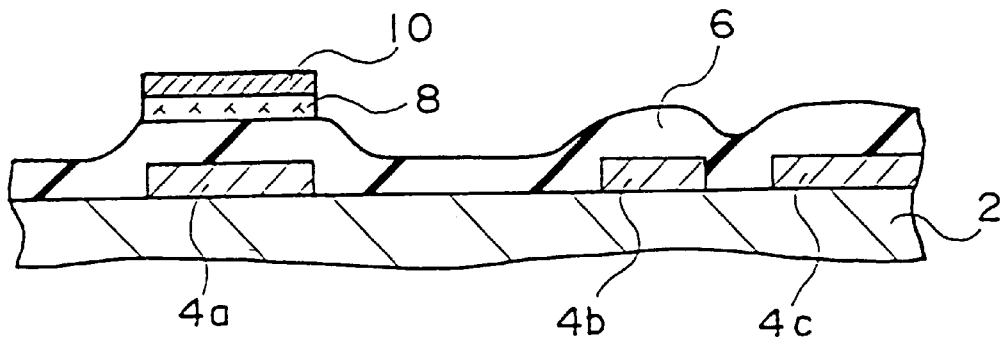
FIGS. 1–6 are cross sectional diagrams of the device following each process, and show the construction method of the thin film element according to the present invention.

As shown in FIG. 1, using photolithography technology on the glass substrate (non-alkali substrate) 2, formation can be accomplished for example of gate electrode 4a formed from Cr (chrome) which has a thickness of 1,300 Å approximately, and gate electrode material layers 4b and 4c. The gate electrode 4a is a gate electrode of the TFT of a bottom gate construction formed in a matrix shape on the pixel. In addition, the gate electrode material 4b becomes the region formed by the protective element used to prevent electrostatic destruction, described hereafter. In addition, the gate electrode material layer 4c becomes the region formed for use in connections with external components, or for the elements used for scanning.

Next, by means of a plasma CVD method, continuous formation is accomplished of amorphous silicon film 8 in which there are no doped impurities, as well as the n type silicon film ((ohmic-phonetic) contact layer) 10; and next, by means of photo-etching, islands can be created of amorphous silicon film 8 and n type silicon film (ohmic contact layer) 10.

In this instance, the thickness of the gate insulation film 6 is for example 3000 Å approximately, and the thickness of the genuine silicon film 8 is for example approximately 3000 Å, and the thickness of the ohmic contact layer 10 is for example approximately 500 Å.

With this process, characteristically there is no formation of a contact hole relative to the gate insulation film.

Process 2

Figure 2:
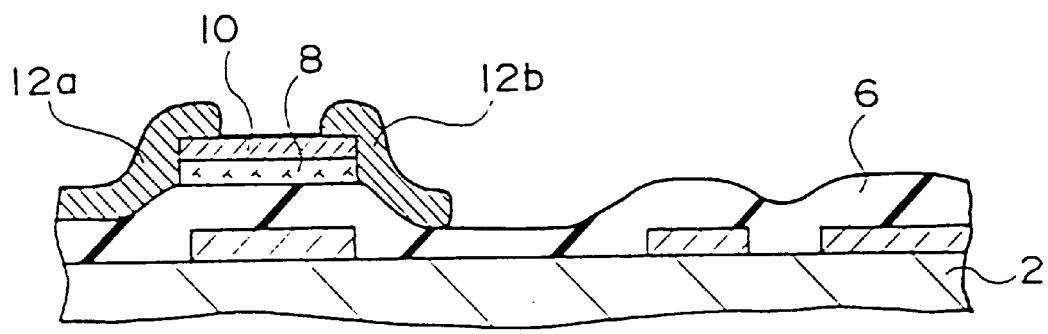

Next, as shown in FIG. 2 for example, formation is accomplished by means of sputtering and photo-etching the source/drain electrodes 12a and 12b of approximately 1300 Å formed from Cr (chrome).

Process 3

Figure 3:
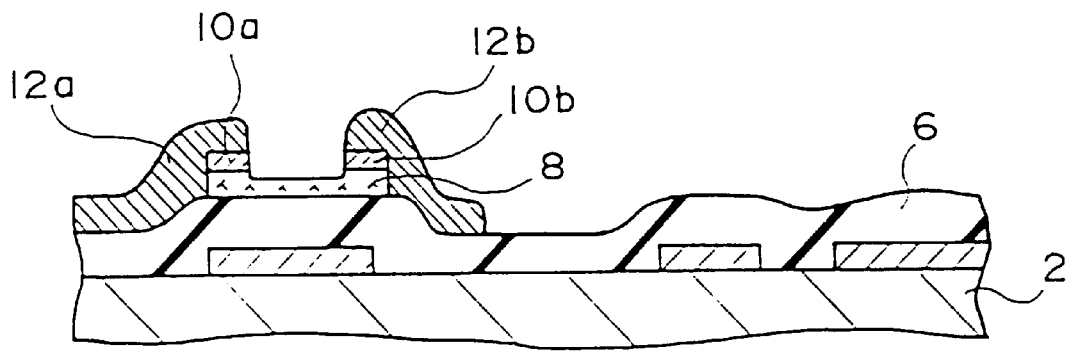

Next, as shown in FIG. 3, utilization is made of the source/drain electrodes 12a and 12b as the mask, and the central portion of the ohmic contact layer 10 is removed by etching, and separation (separation etching) is accomplished on the source/drain. In this instance, etching is accomplished for the purpose of patterning the source/drain electrodes and separation etching can be continuously accomplished within the same chamber of the same etching device.

In other words, first of all etching of the source/drain electrodes 12a, 12b is accomplished using etching gas of the $Cl_2$ type. Continuing, etching of the center portion of the ohmic contact layer 10 can be accomplished by switching to gas of the $SF_6$ type for the etching gas.

Process 4

Figure 4:
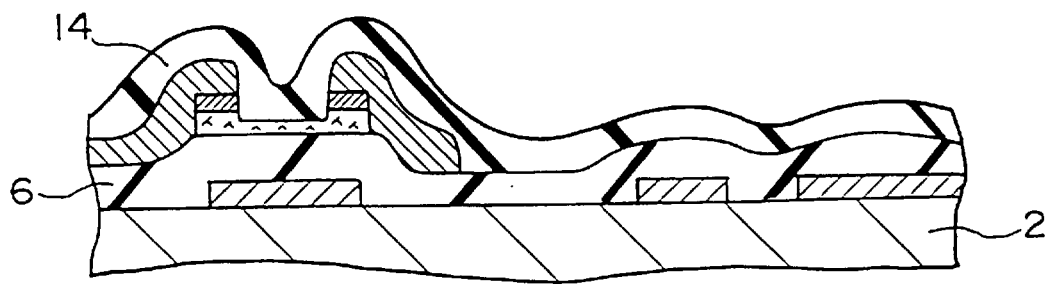

Next, as shown in FIG. 4, formation of the protective film 14 is accomplished, for example, by means of the plasma CVD method. The protective film 14 is for example a silicon nitride film ($SiN_x$) of approximately 2,000 Å.

Process 5

Figure 5:
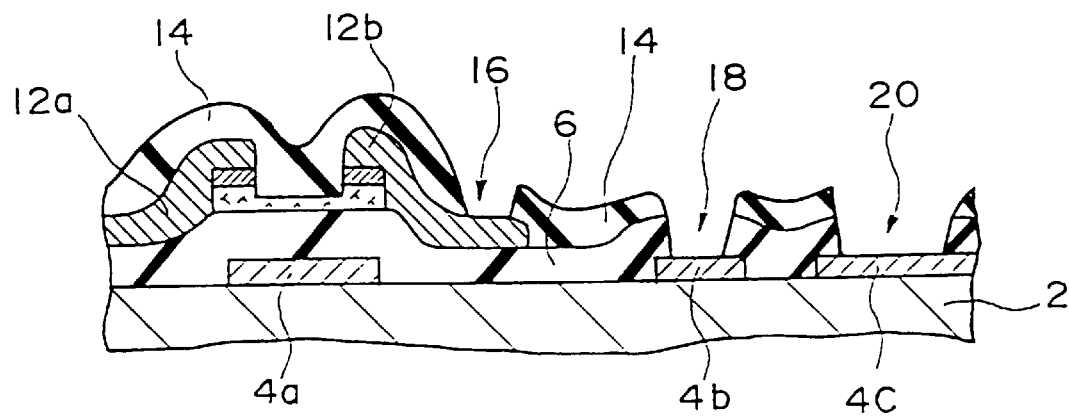

Next, as shown in FIG. 5, contact holes 16, and 18 are formed on a portion of the protective film 14, at the same time as aperture 20 is formed for connecting to the outside terminal (bonding wire or IC outer lead).

The aperture 20 and contact hole 18 are formed so as to pass through the built up film comprising the gate insulation film 6 and the protective film 14. The contact hole 16 is formed so as to only pass through the protective film 14.

When forming the aperture 20 and the contact hole 18, the gate electrode material layer 4b and 4c respectively function as etching stoppers. In addition, when forming the contact hole 16, the source/drain electrode 12b functions as an etching stopper.

Process 6

Figure 6:
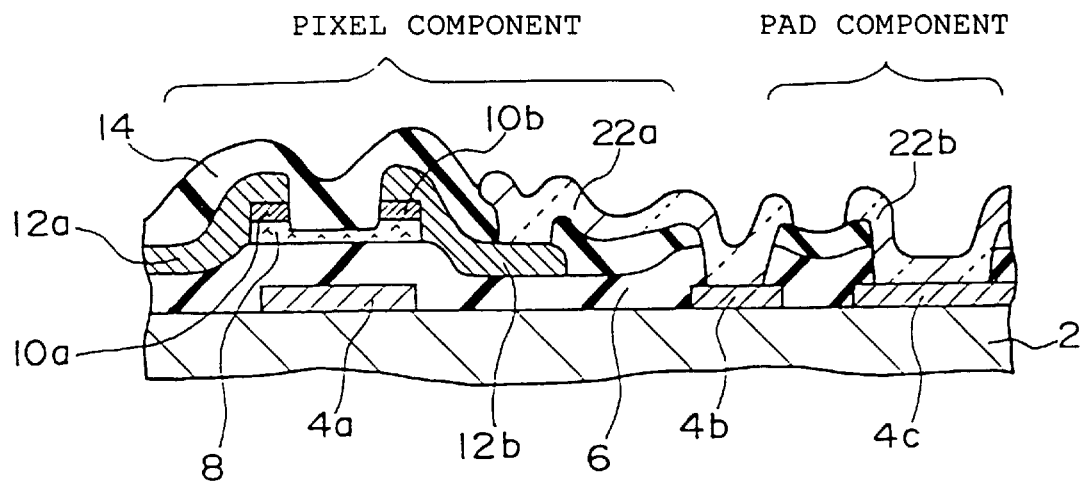

Next, as shown in FIG. 6, ITO (indium tin oxide) film is deposited with a thickness of approximately 500 Å, accomplishing selective etching, and forming wiring 22a and the electrode 22b from the ITO. The etching of the ITO is accomplished by means of wet etching in which utilization is made of a compound liquid of $HCl/HNO_3/H_2O$. As explained, the aperture 20 and the contact hole 18 are formed to pass through the built up film composed of the gate insulation film 6 and the protective film 14. Furthermore, this becomes a contact hole with a depth corresponding to the thickness of the two layer insulation film.

However, since the ITO has a high melting point, the step coverage is good in comparison to aluminum and the like. Furthermore, there is not a poor connection even though the contact hole may be deep. Moreover, other than ITO, utilization may also be made of other transparent electrode materials having a high melting point such as metallic oxide. For example, utilization may be made of metallic oxides such as SnOx and ZnOx. In this case as well, the step coverage is able to also withstand actual application.

The TFT having bottom gate construction which is produced in this manner is used as a pixel switching element in an active matrix substrate. In addition, the electrode 22b formed from the ITO becomes a pad for connecting the external terminal (IC outer lead and the like).

Characteristics of the Present Manufacturing Method

FIGS. 7A–7F show the manufacturing process of the TFT applied to the state of the present embodiment recorded in FIG. 1 through FIG. 6. On the other hand, FIGS. 8A–8G show the manufacturing process of the TFT in a contrast example. This contrast example was considered by the present inventors to clarify the characteristics of the manufacturing process of the TFT applied to the shape of the present embodiment, and is not a prior art example.

Figure 7A:
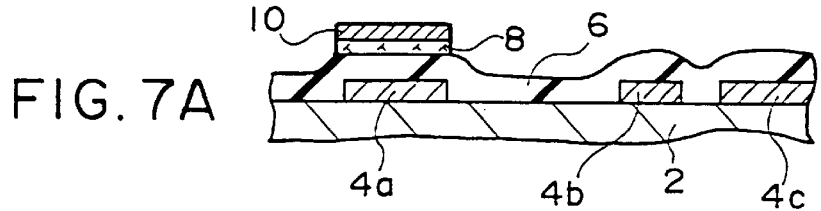
FIG. 7A–FIG. 7F are drawings which explain the characteristics of the manufacturing process technology shown in FIGS. 1–6.
Figure 7B:
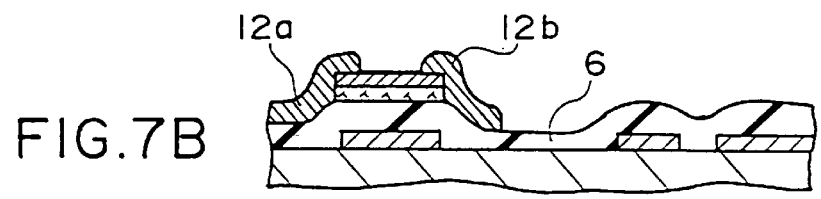
Figure 7C:
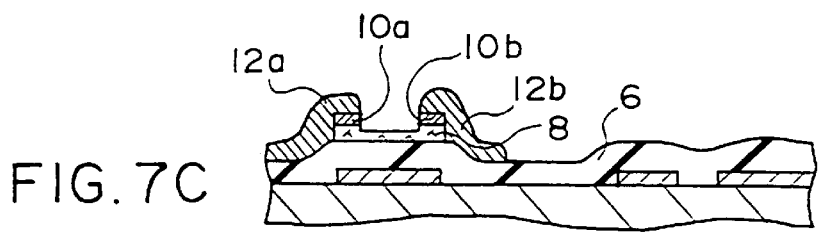
Figure 7D:
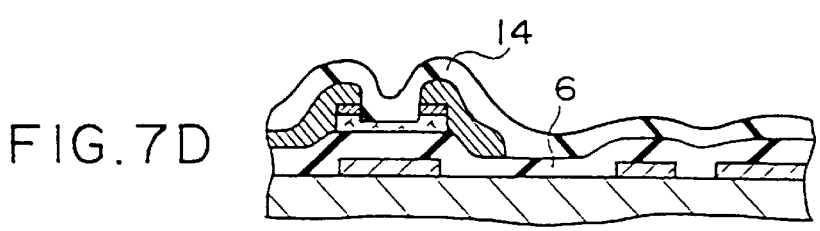
Figure 7E:
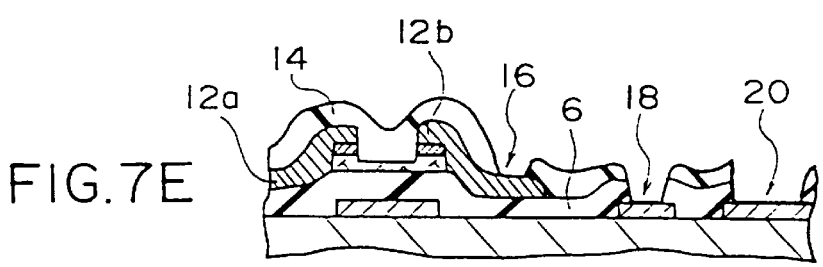
Figure 7F:
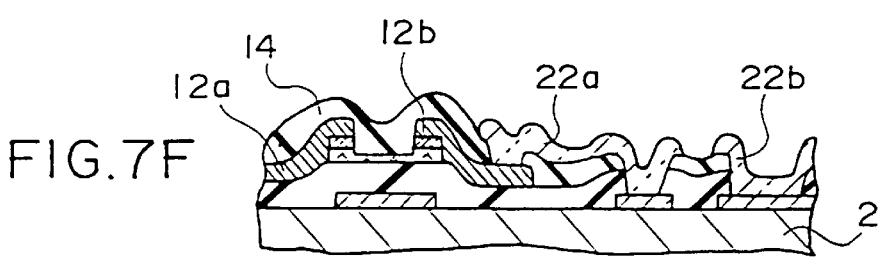
Figure 8A:
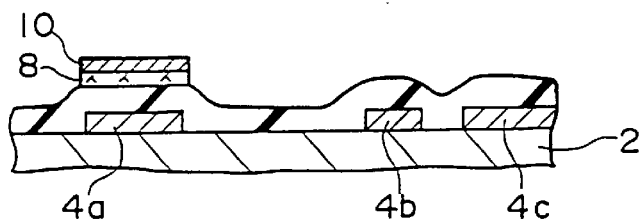
FIGS. 8A–8G are cross-sectional diagrams of the device following each process of a contrasting example.

FIG. 8A of the contrast example is the same as FIG. 7A. In FIGS. 8A–8G, the same reference numbers are applied to the same components as in FIGS. 7A–F.

Figure 8B:
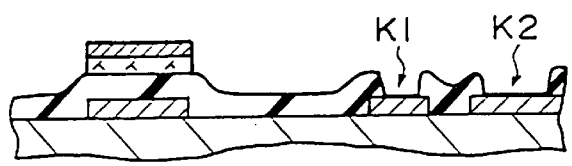

In the case of the contrast example, as shown in FIG. 8B, prior to the creation of the drain electrode layer, the contact holes K1, and K2 are formed.

Figure 8C:
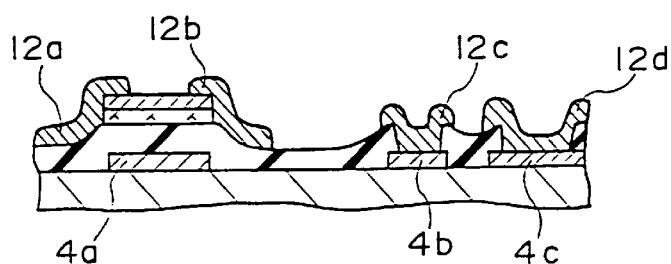
Figure 8D:
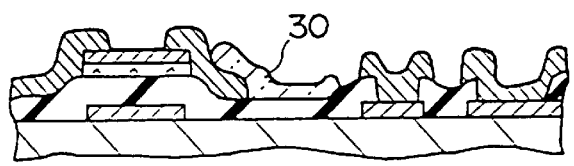
Figure 8E:
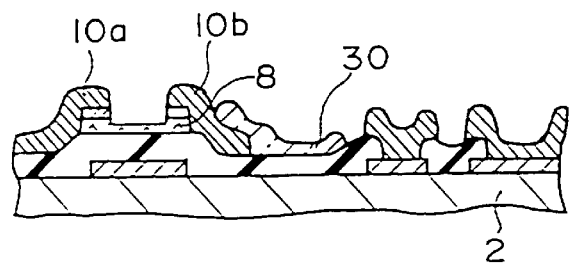
Figure 8F:
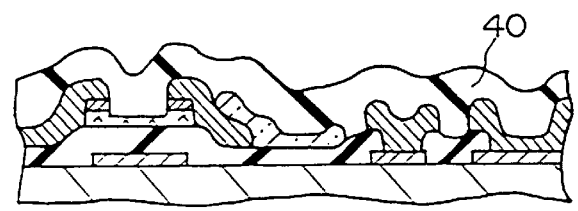

Also, as shown in FIG. 8C, formation is accomplished of the source/drain electrode layers 12a and 12b, as well as the source/drain electrode material layers 12c, and 12d formed from the same materials. Next, formation of the ITO film 30 is accomplished as shown in FIG. 8D. Subsequently, etching (separation etching) is accomplished of the center portion of the ohmic layer 10 as shown in FIG. 8E. Subsequently, formation of the protective film 40 is accomplished as shown in FIG. 8F.

Figure 8G:
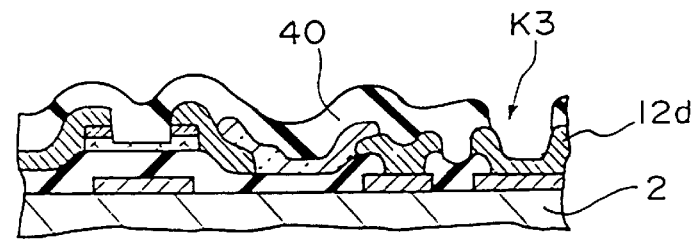

Finally, formation of the aperture K3 is accomplished as shown in FIG. 8G. By this means, the surface of the source/drain electrode material layer 12d is exposed, and the electrode (pad) is formed for the purpose of connecting the external connection terminal.

According to the manufacturing method of this type of contrast example, in the formation process of the contact hole in FIG. 8B, a process is added to form the aperture K3 in FIG. 8G, with the necessity of a total of two aperture formation processes.

In this regard, according to the manufacturing method of the present embodiment, as shown in FIG. 7E, formation is accomplished of apertures 16, 18, and 20 all at once. In other words, at the same time as forming the aperture passing through the built up film comprising the protective film 14 and the gate insulation film 6, through the simultaneous patterning also of the protective film 14 on the source/drain electrode layer 12b, the aperture formation process may be accomplished at one time. Furthermore, the light exposure process can be reduced by one process. In accompaniment with this, the process of depositing the photo resist film, and its etching process becomes unnecessary. Furthermore, altogether there is a reduction of three processes. In other words, the manufacturing process is simplified.

In addition, according to the manufacturing method of the present embodiment, patterning (dry etching) of the source/drain electrode 12a and 12b are continued as shown in FIG. 7b and the etching (dry etching) of the center part of the ohmic contact layer 10 shown in FIG. 7C is continued, and is accomplished within the same chamber. In other words, by chronologically switching the etching gas within the same chamber, it is possible for etching to be continued.

In this regard, in the case of the contrast example, following the patterning (dry etching) of the source/drain electrode layers 12a and 12b of FIG. 8C, wet quenching is accomplished of the ITO film 30 of FIG. 8D, and subsequently, the etching (dry etching) is accomplished of the center portion of the ohmic layer 10 of FIG. 8E. The ITO film cannot be processed by means of dry etching, and since there is no accomplishment of processing by means of wet etching, each of the etching processes shown in FIGS. 8C, 8D, and 8E, cannot be continuously accomplished within a single chamber. Hence, it becomes necessary for the substrate to be handled following each process, making the operation inconvenient.

In addition, in the case of the shape of the present embodiment, the protective film 14 is necessarily present between the ITO films 22a and 22b, and the source/drain electrodes 12a, 12b. This being the case, in the other regions (not shown in the drawing) of the substrate, it means that the wiring formed from the ITO film, and the wiring or electrodes formed from the same material as the source/drain electrodes are assuredly and electrically separated.

However, in the case of the contrast example, the ITO film 30 and the source/drain electrodes 10a, 10b belong in the same layer. In other words, both are laminated, and no protective layer is present between the two. Hence, in other regions (not shown in the diagram) of the substrate, if foreign matter is present, then notwithstanding the fact that they must be insulated thereafter, there is the concern that wiring formed from the ITO film, and wiring or electrodes formed from the same material as the source/drain electrodes will become completely shorted. In other words, the device formed by the method of manufacture of the present embodiment has high reliability.

In addition, with the contrast example, in order to form (in FIG. 8D) the ITO film 30 by means of a relatively fast step, in the subsequent processes, there is some concern of staining by means of indium (In) or tin (Sn) comprising the ITO composite product.

In this regard, with the method of manufacture according to the present embodiment, since the ITO film 22a and 22b is formed in the final process, there is little concern of staining being caused by the tin (Sn) comprising the ITO composite.

In this manner, according to the method of manufacture of the present embodiment, the manufacturing process can be shortened, and a device can be manufactured having high reliability.

Second Embodiment

Next, an explanation of the second embodiment of the present invention is provided hereafter with reference to FIGS. 9 through 18.

Figure 9:
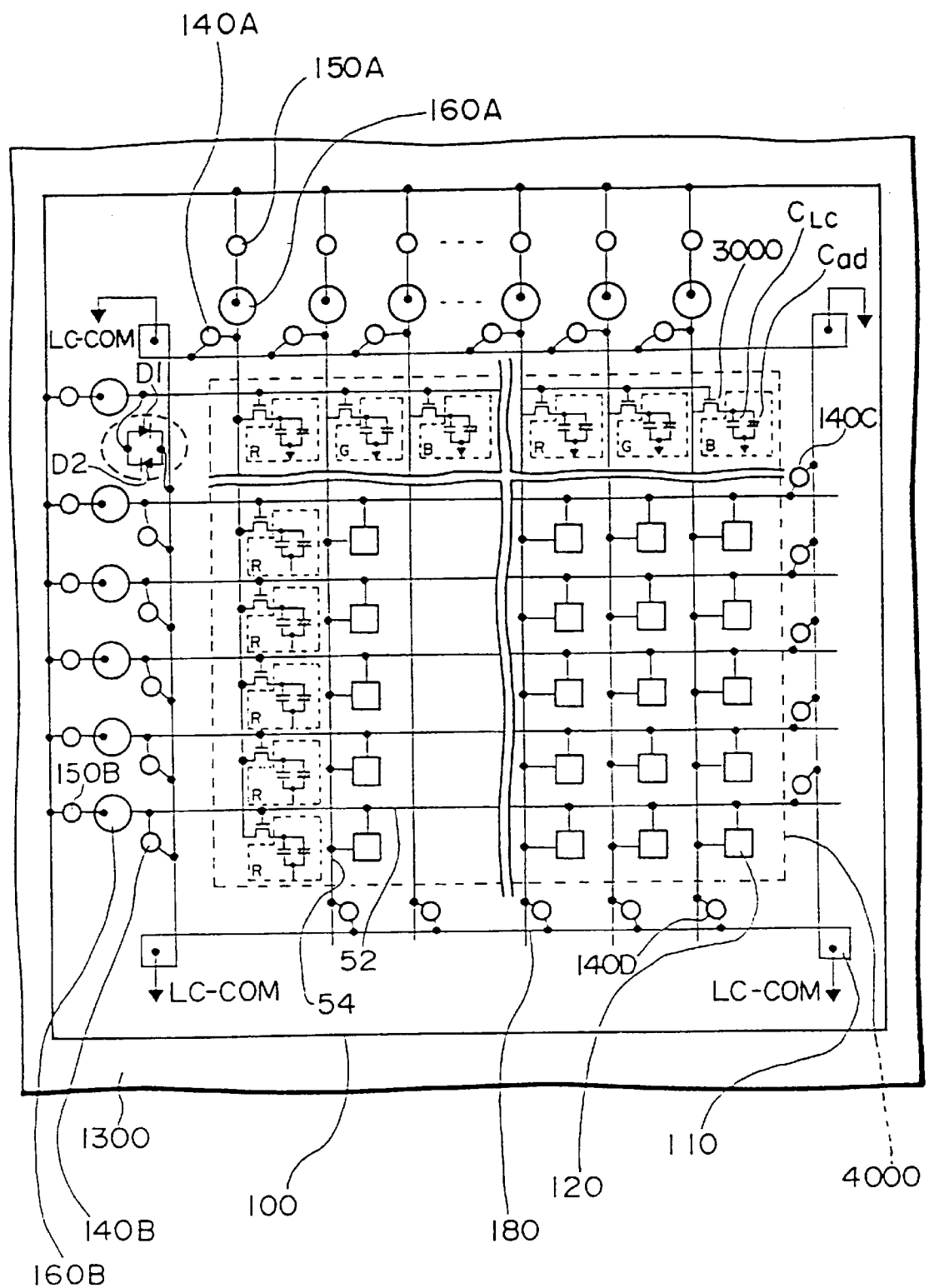
FIG. 9 is a diagram which shows a compositional example of the TFT substrate according to the present invention.

FIG. 9 is a diagram which shows the plane surface layout of an active matrix substrate in which application is made of the second embodiment of the present invention.

The active matrix substrate of FIG. 9 is utilized in a liquid crystal display device. As the protective elements used as switching elements for the pixels, and used to prevent electrostatic destruction, utilization is made of TFT manufactured by the manufacturing method explained in the first embodiment.

The pixel parts 4000 (in the diagram shown by the dotted line) are formed from multiple pixels 120, and each pixel is composed to include TFT (switching element) 3000. The TFT 3000 is attached to the intersecting points of the scanning line 52 and the signal line 54.

To each end of the signal line 54 and the scanning line 52 is respectively attached a pad 160A, and 160B, with the first protective element 140A and 140B being connected between the pad and the LC-COM line 180, with a second protective element 150A, and 150B being formed between the pad and the guard ring 100. Furthermore, the LC-COM line 180 is also connected to the facing electrode through the silver point pad 110.

"Pads 160A and 160B" are electrodes for connecting the bonding wire or the (bump-phonetic) electrode or for connecting electrodes (external terminals) which use polyimide tape.

In addition, the "LC-COM line 180" is a line to which an electric potential is applied which becomes the standard liquid crystal drive. The common electric potential LC-COM, for example, as shown in FIG. 30 is established to the electric potential which is reduced only DV by means of the midpoint electric potential $V_B$ of the display signal voltage $V_X$. In other words, as shown in the example in FIG. 29, in the pixel TFT 3000, a capacity $C_{GS}$ is present between the gate/source, and with its influence, between the display signal voltage $V_X$ and the final maintained voltage $V_S$ is produced the voltage potential difference DV. In order to compensate for the electric potential difference DV, the electric potential reduced by only DV becomes the joint standard electric potential by means of the midpoint electric potential $V_B$ of the display signal voltage $V_X$.

Figure 29:
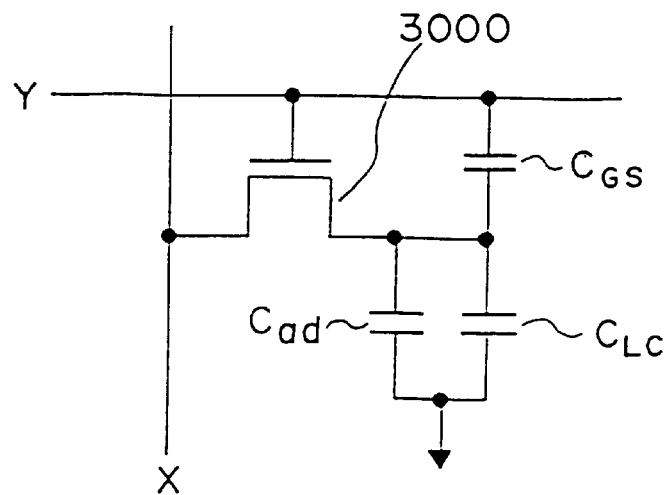
FIG. 29 is a circuit diagram which shows the composition of the pixel components of the liquid crystal display device of an active matrix type.
Figure 30:
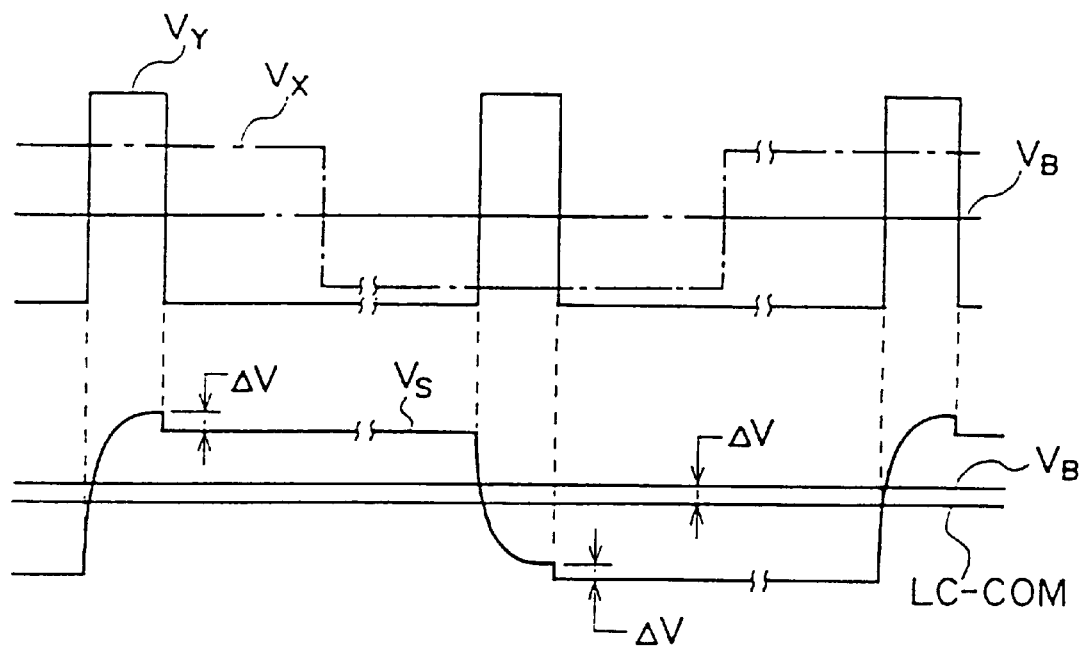
FIG. 30 is a diagram which shows the voltage wave form for driving the liquid crystal in the pixel component of FIG. 29.

Furthermore, in FIG. 29, X represents the signal line, and Y represents the scanning line, $C_{LC}$ shows the equivalent capacity of the liquid crystal, and the $C_{ad}$ shows the maintenance capacity. In addition, in FIG. 30, $V_X$ represents the displayed signal voltage which is supplied to the signal line X, and $V_y$ is the scanning signal voltage supplied to the scanning line Y.

In addition, the guard ring 100 is a line which is attached to the outside of the pads 160A and 160B as an electrostatic countermeasure to the manufacturing stage of the liquid crystal display device.

Both the LC-COM line 180 and the guard ring 100 are joint electric potential lines, and continuing, the electrostatic electricity avoids these lines by the connection of a protective diode between the pad and these lines.

Figure 27:
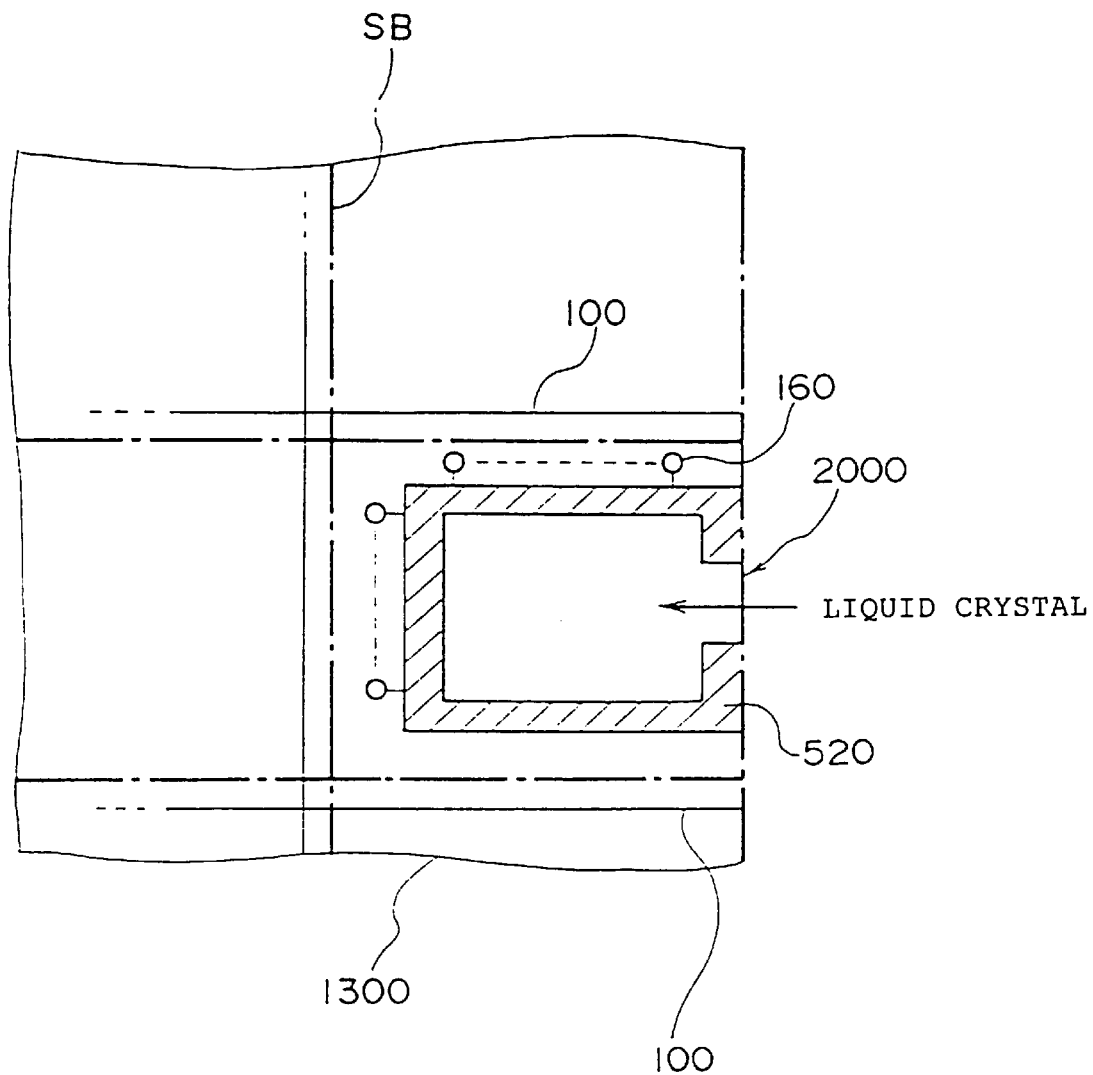
FIG. 27 is a diagram for explaining the dividing process of the substrate by means of a cell division device.

In addition, the guard ring 100, as shown in FIG. 27, following the emulation of the TFT substrate 1300 and the opposing substrate (color filter substrate), completely cuts off along the scribe line (SB) prior to the connection of the IC for drive use, however, the LC-COM line 180 is a line which remains in the final product. Furthermore, following the substrate cutoff, even prior to the connection of the IC, the TFT of the pixel components are protected from electrostatic destruction by means of the first protective element 140, and continuing, there is improved reliability of the product.

In addition, since the protective diode also remains in the final product, there is also an improvement in the electrostatic destructive protection strength in the actually used final product.

Furthermore, since the protective diode utilizes the TFT, the control of the threshold value voltage ($V_{th}$) is easy, and since the amount of leaking electric current can also be reduced, there is no negative influence even if the diode remains in the final product.

Figure 11A:
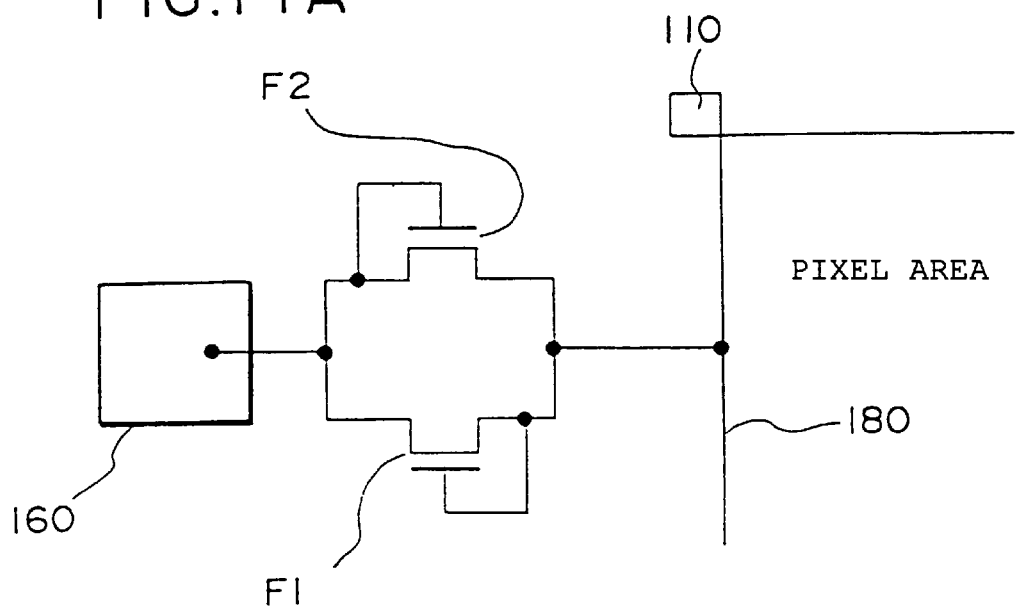
FIG. 11A shows the composition of the electrostatic protection circuit.
Figure 11B:
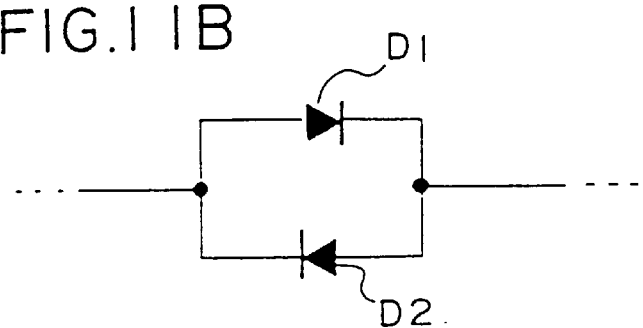
FIG. 11B shows the equivalent circuit of an electrostatic protection circuit.
Figure 11C:
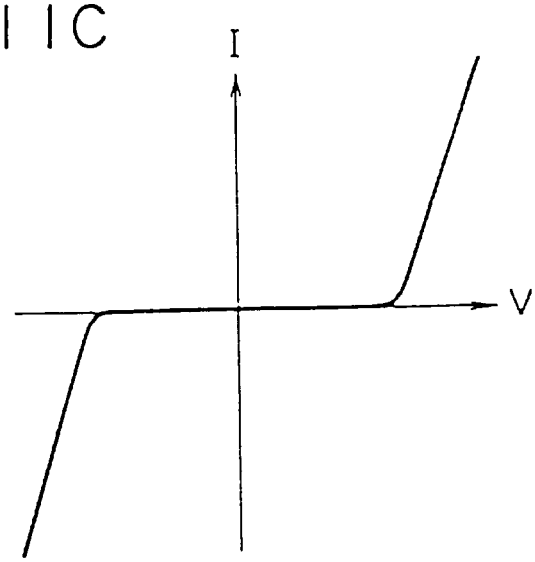
FIG. 11C is a diagram which shows the electric voltage/electric current characteristics of an electrostatic protection circuit.

A practical embodiment of the protection elements is shown in FIGS. 11A–11C.

In other words, as shown in FIG. 11A, the protective element connects the MOS diode formed from the connection of the gate/drain of the first TFT (F1), and the MOS diode formed by connecting the gate/drain of the second TFT (F2) mutually in the reverse direction, in parallel. The equivalent circuit is such as that which is shown in FIG. 11B.

Furthermore, as shown in FIG. 11C, the protective element has nonlinear shape characteristics in both directions, in terms of the electric current/electric voltage characteristics. Each diode is given a high impedance at the time of low voltage impression, becoming a low impedance state at the time of high voltage impression. In addition, each diode is substantially a transistor, and the electric current flow capacity is great, and since the static electricity can be quickly absorbed, the static electric protective performance is high.

Figure 10:
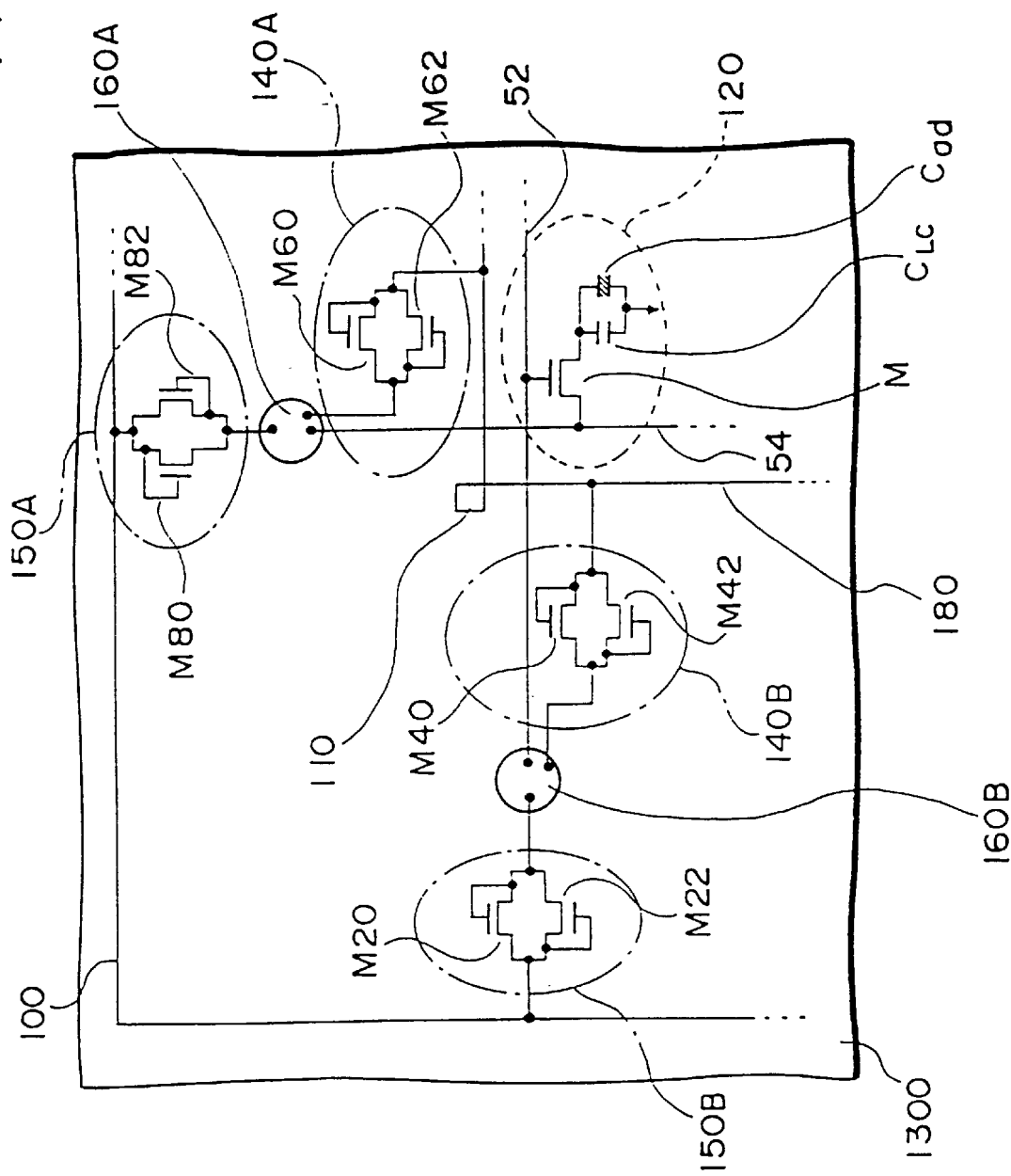
FIG. 10 is a diagram which shows the composition in the pad periphery of the TFT substrate of FIG. 9.

FIG. 10 shows a practical arrangement of the static electricity protective elements in the periphery of the pads 160A and 160B of FIG. 9.

The protective element 140A of FIG. 1 is constructed by means of thin film transistors M60 and M62 which are connected between the gate/drain, and in the same manner, the protective element 140B of FIG. 1 is formed from the thin film transistors M40 and M42.

In the same manner, both the second protective elements 150A and 150B are formed from the thin film transistors M80, M82, M20, and M22.

These protective elements are turned on when there is the impression of a excessive positive or negative surge, and there is movement so that the LC-COM line 180 or the guard ring 100 avoid the surge. In addition, a second protective element 150 arranged on the other side of the pad is added to the function of the electrostatic protection, and each of the pads 160 are shorted by the guard ring 100, with the function of preventing a final scan from becoming impossible in the array process. An explanation of this is provided hereafter with reference to FIG. 14.

Figure 14:
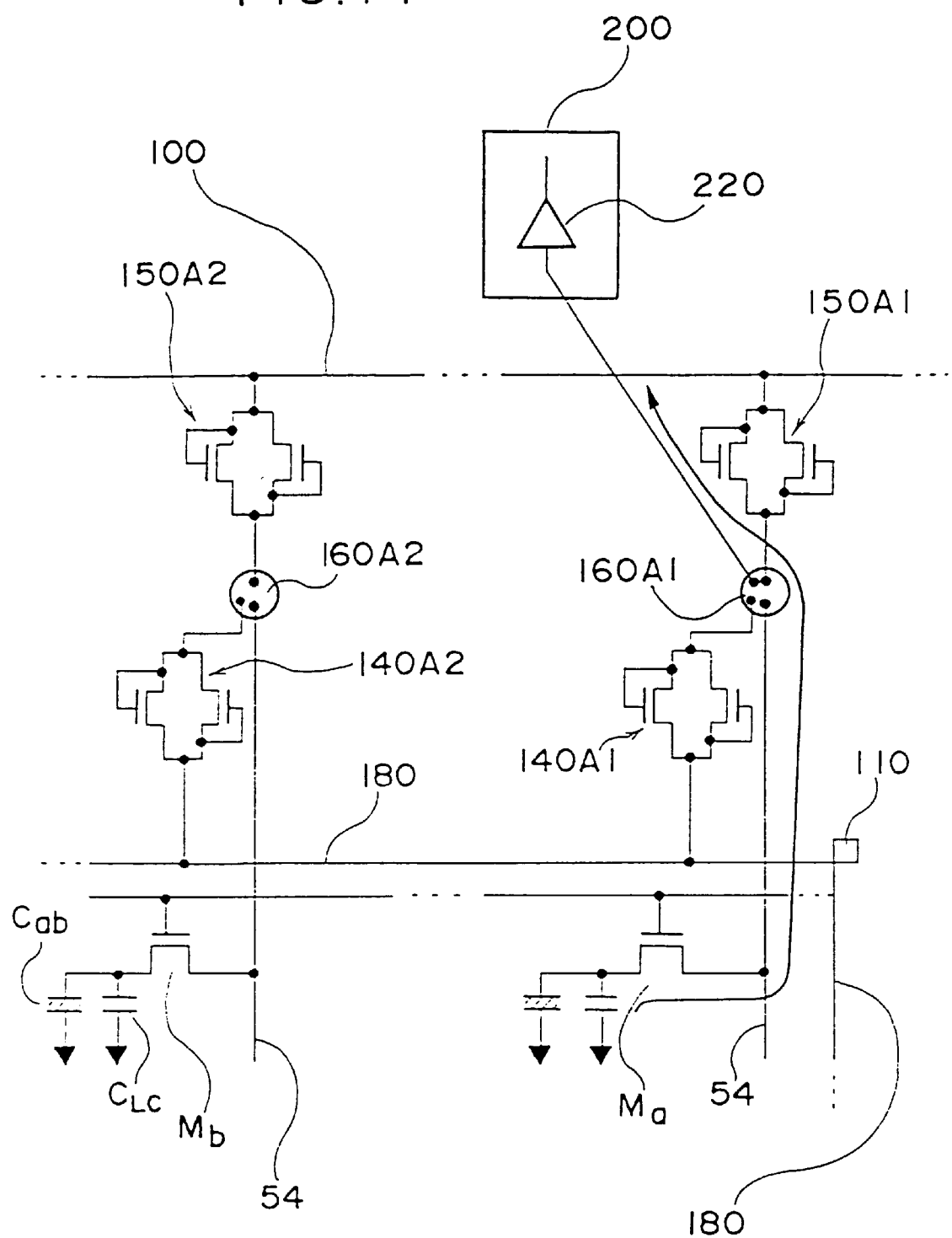
FIG. 14 is a diagram for explaining the function of the electrostatic protection circuit.

As shown in FIG. 14, a case where the probe of the array tester 200 (which has 220 amp) is connected to the pad 160A1 to test the pixel TFT (Ma) is considered.

At this time, the second protective element 150A1 and the second protective element 150A2 maintain a state of high impedance, and furthermore the pixels TFT (Ma) and TFT (Mb) are electrically separated. Hence, crosstalk with other transistors is prevented, and experimentation can be accomplished only relative to the specified TFT (Ma).

In addition, as shown in FIG. 27, when the creation of the TFT substrate 1300 is complete, then following the completion of each of the processes comprising the coating of the facing film, the rubbing process, the coating process of the seal material (spacer), the substrate emulation process, the dividing process, and the liquid crystal injection and seal prevention process, then prior to the connection of the IC used for the drive, by cutting off along the scribe line (SB), the guard ring 100 is completely removed.

However, since the first protective element 140 connected between the LC-COM line 180 and the pad 160 is present, then even prior to the connection of the IC used as the drive, electrostatic protection is accomplished.

Furthermore, the first protective element also remains in the final product, however, with the protective element which uses TFT in order to accomplish positive threshold control, there is no concern of reducing the reliability of the product by means of the leakage of electric current and the like.

Figure 12:
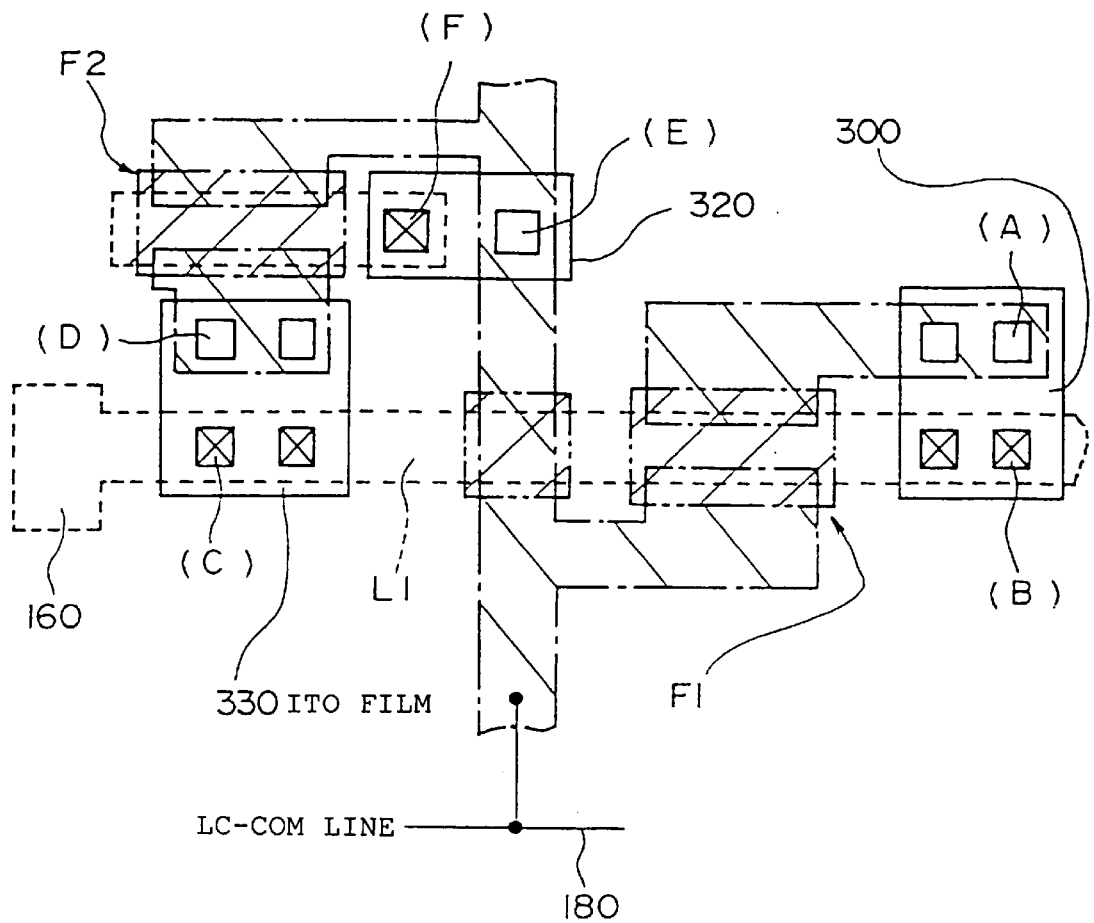
FIG. 12 is a diagram which shows the plane surface layout of an electrostatic protection circuit.
Figure 13:
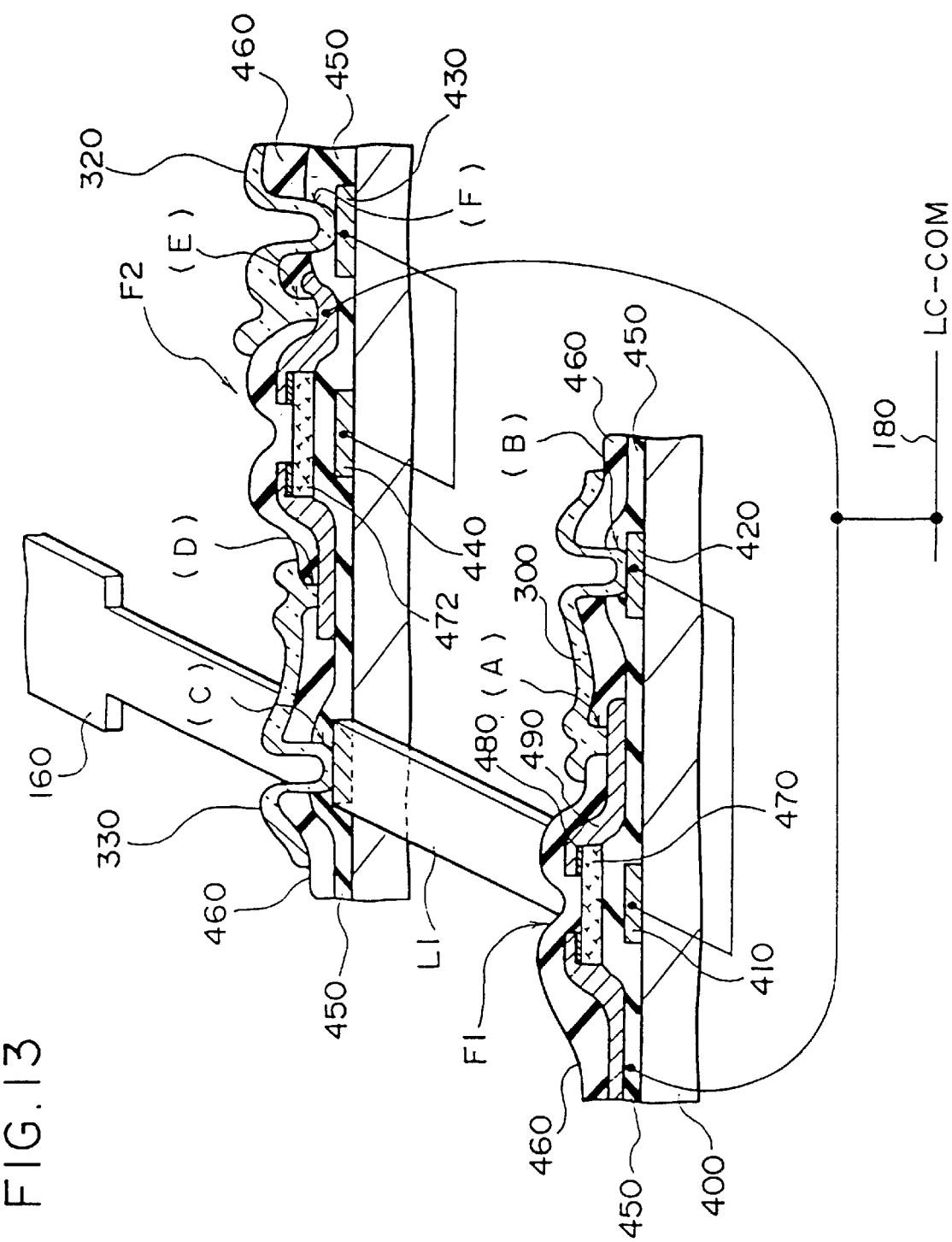
FIG. 13 is a diagram for explaining the composition of an electrostatic protection circuit of FIG. 12, using cross-sectional construction of the device.

Next, an explanation is provided of the construction of the device of the first and second transistors (F1, F2) shown in FIG. 11A, with reference to FIG. 12 and FIG. 13.

With the present embodiment, as shown in FIG. 12, the film (ITO film) 300, 320, and 330 formed from the ITO comprising the pixel electrode material is used as the wiring used to connect the gate/drain.

The cross-sectional construction corresponding to each component (A)–(F) in the plane layout of FIG. 4 is shown in FIG. 13.

As shown in the figure, the first thin film transistor F1 and the second thin film transistor F2 which compose the static electricity protection element are both provided with a reverse stagger construction (bottom gate construction).

In other words, formation of gate electrode layers 410, 420, 430, and 440 is accomplished on the glass substrate 400, formation of a gate insulation film 450 being accomplished on it, forming genuine amorphous silicon layers 470, and 472, and forming a drain electrode (source electrode) layer 492 through the n type ohmic layer 480, a protective layer 460 being formed so as to cover each of these layers. Also, connections are established between the gate/drain by means of the films (ITO films) 300, 320, and 330 formed from the IPO which comprises the pixel electrode material.

The ITO films 300, 320, and 330 connect the gate electrode layer and the drain electrode layer through the contact hole which passes through the two films of the gate insulation film 450 on the gate electrode layer, and the protective film 460; and through the contact hole which passes through the protective film 460 on the drain electrode layer 490.

In this case, the ITO has superior step coverage at high melting points in comparison with those held by aluminum and the like, owing to which good contact is assured even through a deep contact hole passing through the two film layers.

In addition, as explained in the first embodiment, the contact hole relative to the gate/source is formed at the same time in the process of forming the aperture (pad open) for connecting the external connection terminal, thereby shortening the number of processes.

Above, an explanation has been provided with respect to an example for forming the protective diode using the ITO film as wiring. However, the use of the ITO film as wiring is not limited to this, and for example it is possible for utilization to also be made of a format such as that shown in FIG. 15.

Figure 15:
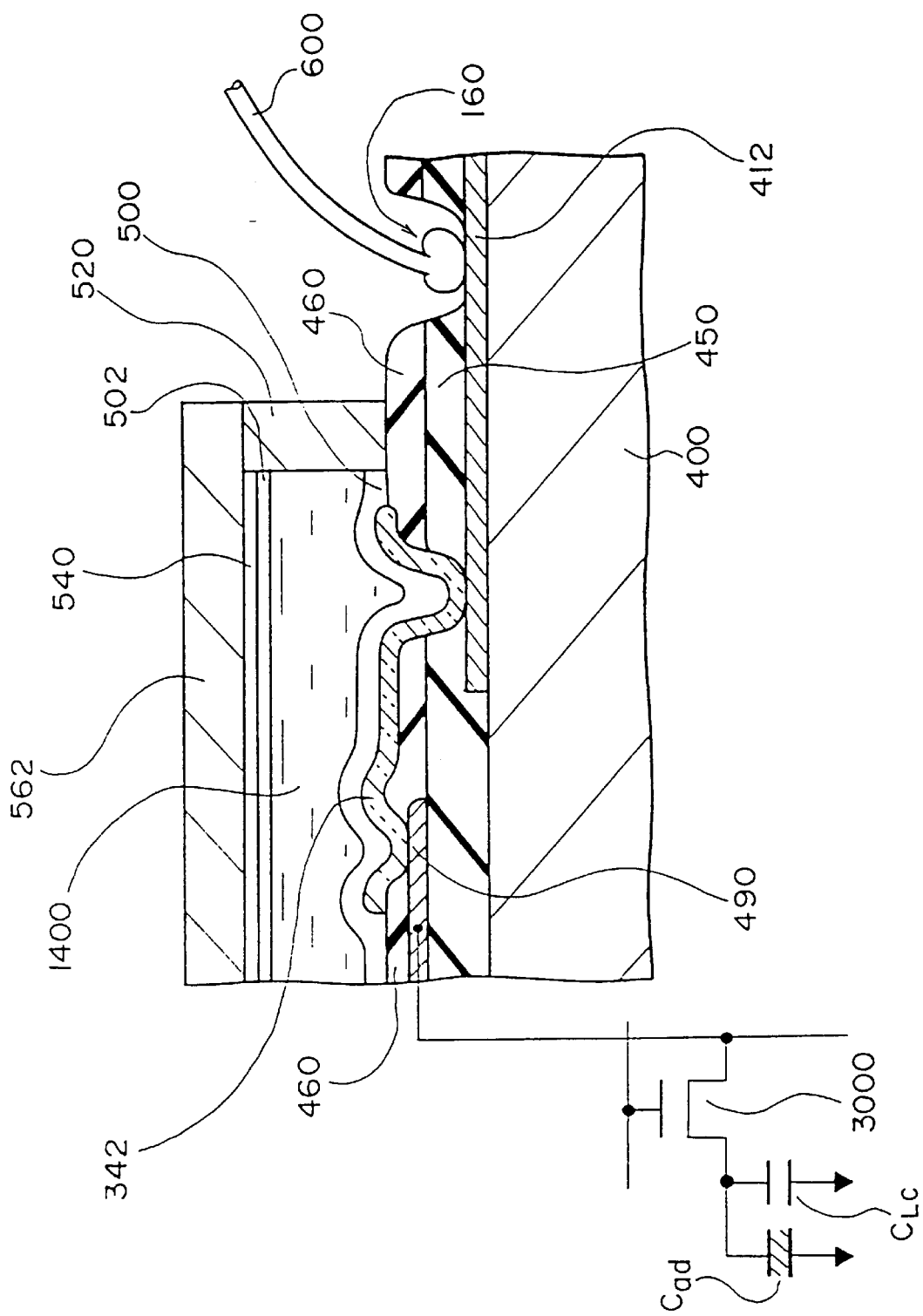
FIG. 15 is a diagram which shows a sample structure when the wiring of the liquid crystal panel is led to the bonding pad.

In other words, in FIG. 15, the ITO film 342 is used in the formation of the cross under wiring 342 in the vicinity of the pad 160.

The "cross under wiring" at the time of leading the inner wiring of the liquid display device toward the outside of the seal material 520, in order to achieve protection of the wiring by means of a thick insulation film between the layers, connects the wiring of the upper layer to the wiring of the lower layer, and comprises wiring which is utilized to conduct round about to the outside.

In other words, the ITO film 342 connects the drain electrode layer 490 and the layer (gate electrode material layer) 412 which is formed from the same material as the gate electrode. By this means, the components led to the outside of the gate electrode material layer 412 are protected in both directions by the gate insulation film 450 and the protective film 460, improving reliability.

Furthermore, in FIG. 15, the reference numbers 500 and 502 show facing film arrangement, 520 shows the seal material, 540 shows the opposing electrodes, 562 shows the glass substrate, and 140 shows the liquid crystal. In addition, connection of the bonding wire 600 is accomplished, for example, on the pad 160. In substitution for the bonding wire, there are also cases when connection is accomplished of the electrode layers utilizing the (bump-phonetic) electrode or the polyimide film.

Figure 16:
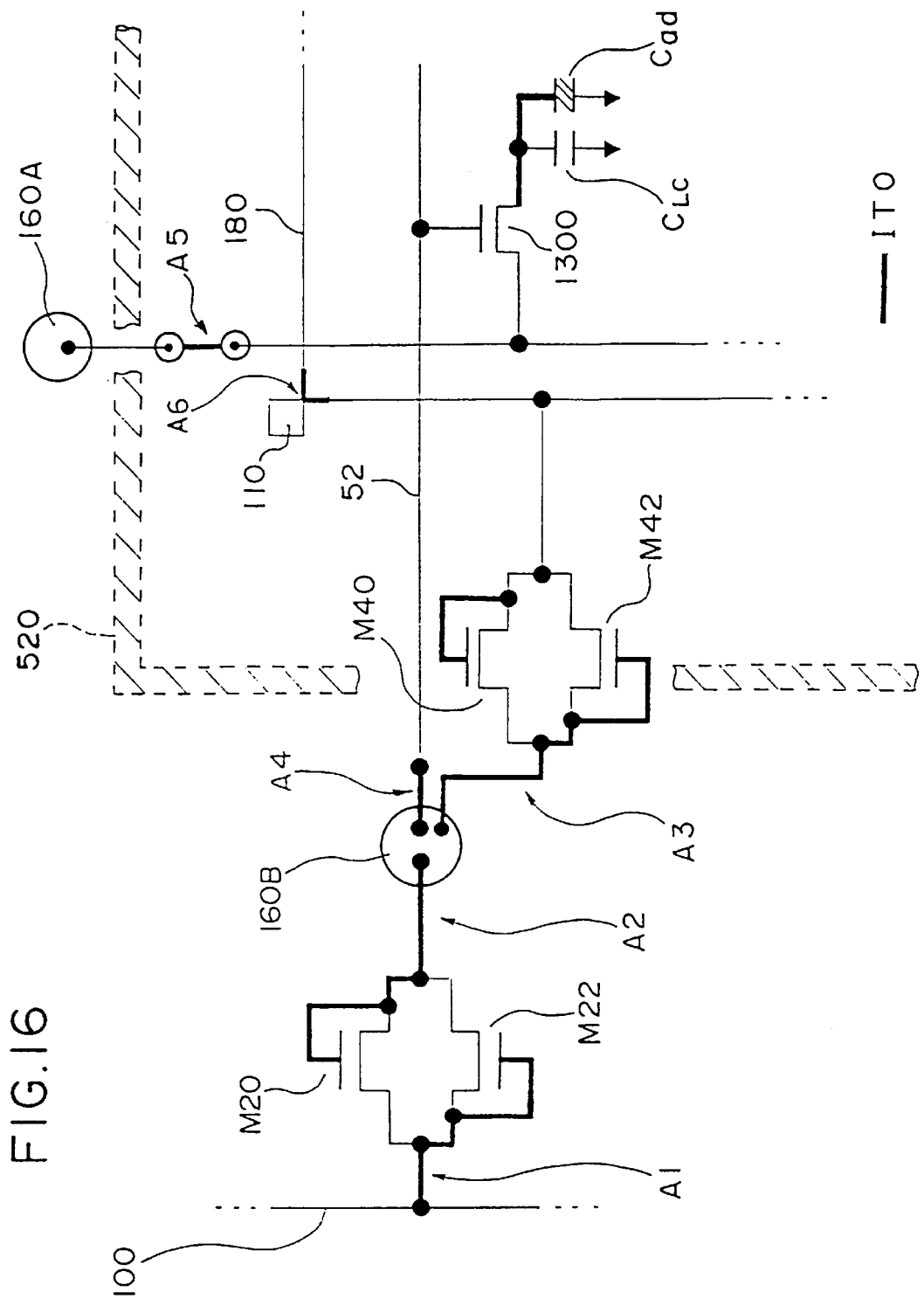
FIG. 16 is a diagram which shows an example of the location for ITO use in a region which excludes the pixels in an active matrix substrate according to the present invention.

The ITO film may also be used as wiring in various other locations. FIG. 16 shows an easily understood example of locations in which utilization of the ITO film may be used as wiring.

In FIG. 16, the ITO film is shown as a fat solid line.

The ITO film in the locations A1–A3 is utilized as wiring for the formation of the protective element, and in location A4, the ITO film is utilized as wiring for connecting the scanning line 52 and the pad 160B, and in location A5, the ITO film is used as the cross-under wiring shown in FIG. 15.

In addition, in location A6, the ITO film is used as wiring for connecting the horizontal LC-COM line and the perpendicular LC-COM line. In other words, the horizontal LC-COM line is formed from a gate material, and the perpendicular LC-COM line is formed from a source material, owing to which it is necessary for both to be connected by the ITO.

Furthermore, in location A6 in FIG. 16, the silver point pad 110 may be formed as a unit by means of the same process as one of either the horizontal LC-COM line or the perpendicular LC-COM line, and when thus formed, connection of the silver point pad 110 and the LC-COM line (either the horizontal or perpendicular line) not formed in a unit may be accomplished through the silver pad 110 and the ITO.

Figure 17:
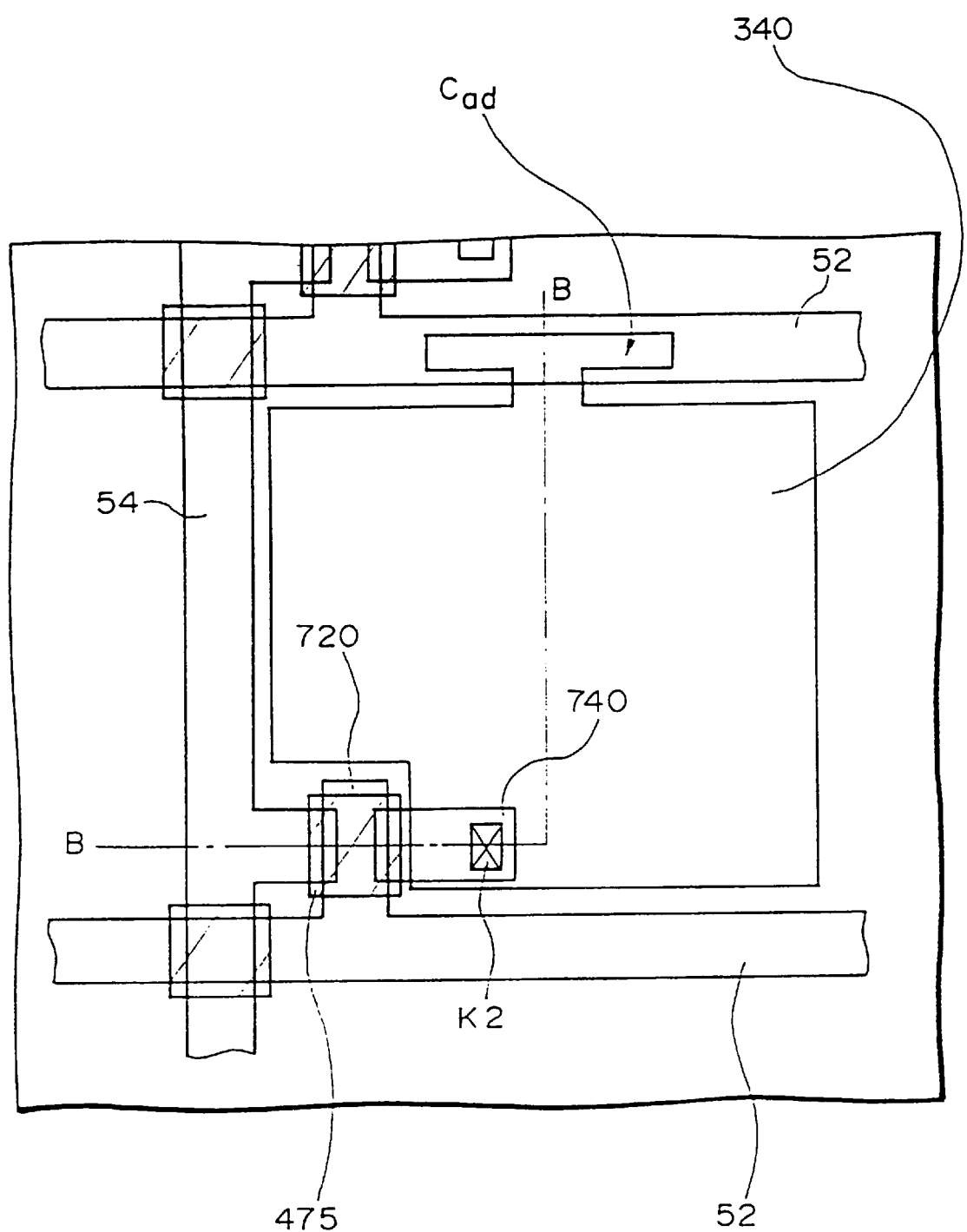
FIG. 17 is a diagram which shows the plane surface layout form of the pixels in the liquid crystal display device according to the present invention.
Figure 18:
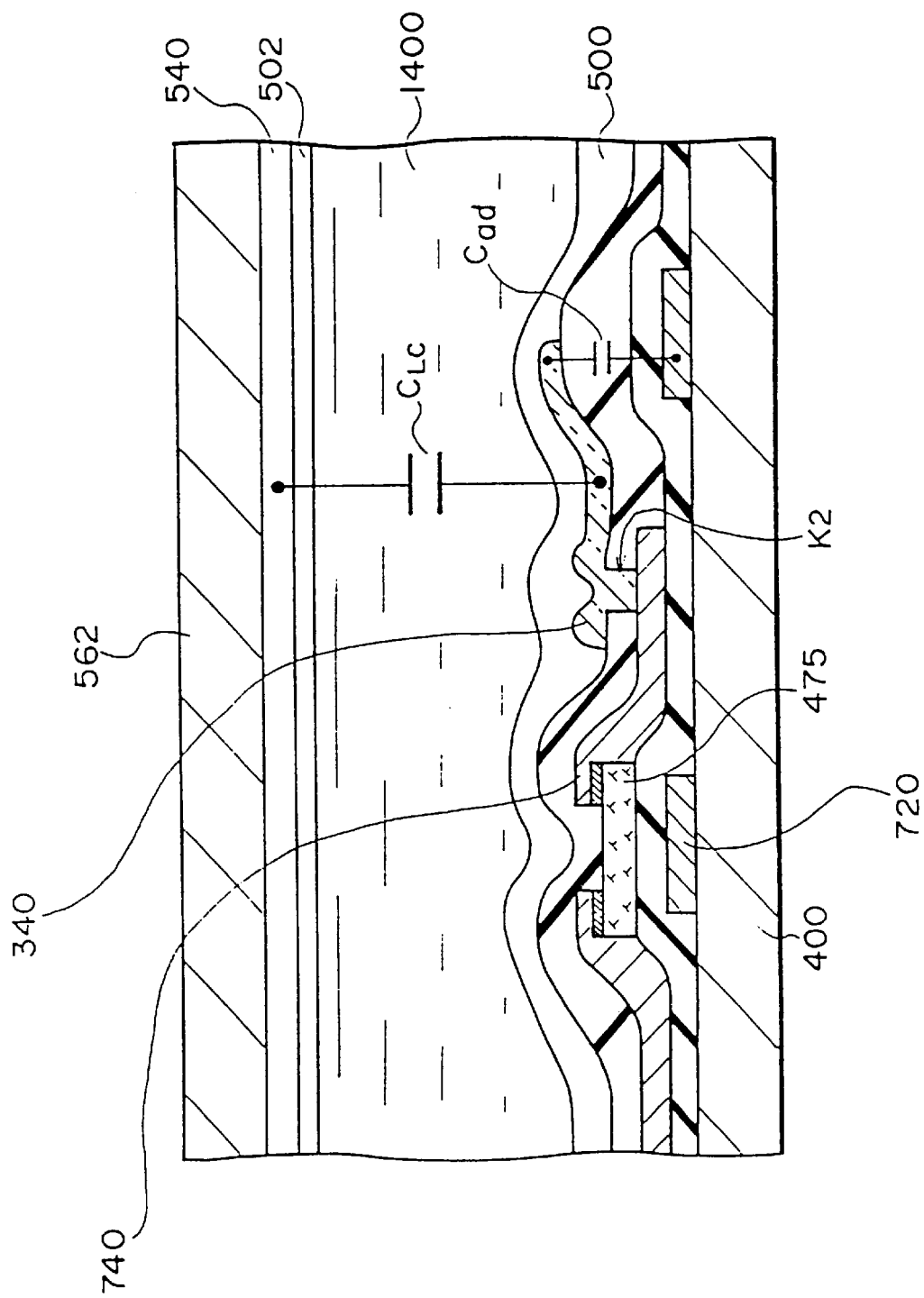
FIG. 18 is a diagram which shows a cross-section of the liquid crystal display device along the line B—B of FIG. 17.

Next, an explanation is provided with regard to the construction of each pixel of the pixel components, with reference to FIGS. 17 and 18.

FIG. 17 shows a plane surface layout of the pixel component.

The TFT (constructed so as to include a gate electrode 720, a drain electrode 740, and a genuine amorphous silicon layer 475 in which no impurities are doped) is arranged to function as a switching element and is connected to the scanning line 52 and the signal line 54. The pixel electrode (ITO) 340 is connected to the drain electrode 740. In the diagram, K2 represents the contact hole, and $C_{ad}$ shows the maintenance capacity. The maintenance capacity $C_{ad}$ is composed from a buildup of proximate gate wiring and extended pixel electrodes.

FIG. 18 is a diagram which shows the cross-sectional construction along the line B—B in FIG. 17. The cross-sectional construction is the same as the structure described in FIG. 15.

Third Embodiment

An explanation is provided hereafter with regard to the method of manufacture of the TFT substrate applied in the second embodiment described above, with reference to FIGS. 19–26.

In each diagram, the left side is a region in which the switching transistor of the pixel element is formed, and the center region is the region in which the protective element is formed, and the right region (pad component) is where the external connection terminal is connected.

Figure 19:
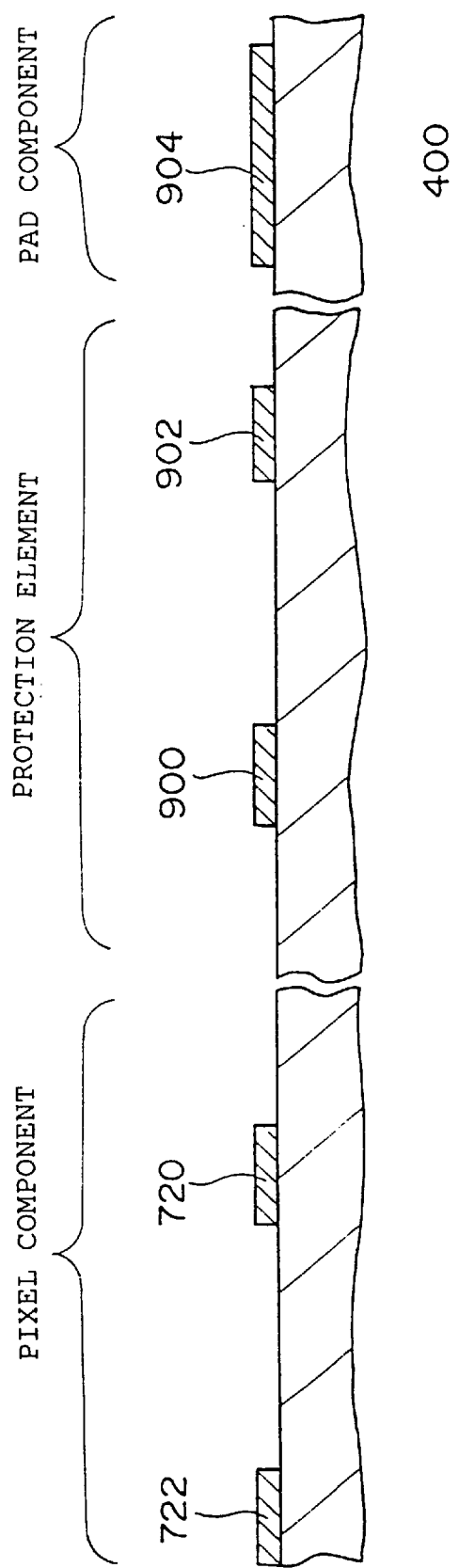
FIGS. 19–25 are respective cross-sectional diagrams of the device following each process which shows the method of construction of an active matrix substrate according to the present invention.

(1) As shown in FIG. 19, first of all, utilization is made of photo lithography technology on the glass (non-alkali substrate) substrate 400. For example, formed are the electrodes 720, 722, 900, 902, 904 which are formed from Cr (chrome) having a thickness of about 1800 Å.

The Cr deposit is accomplished with a reduced pressure of 50 mTorr utilizing a magnetron sputter device. In addition, the Cr process is accomplished by means of dry etching in which utilization is made of $Cl_2$ type gas.

Reference numbers 720, 900 are layers (gate electrode layers) which become TFT gate electrodes, wherein reference number 722 is a layer which corresponds to the scanning line 52 shown in FIG. 17. In addition, reference numbers 902, and 904 are layers (gate electrode material layers) which are formed from the same material as the gate electrode layer.

Figure 20:
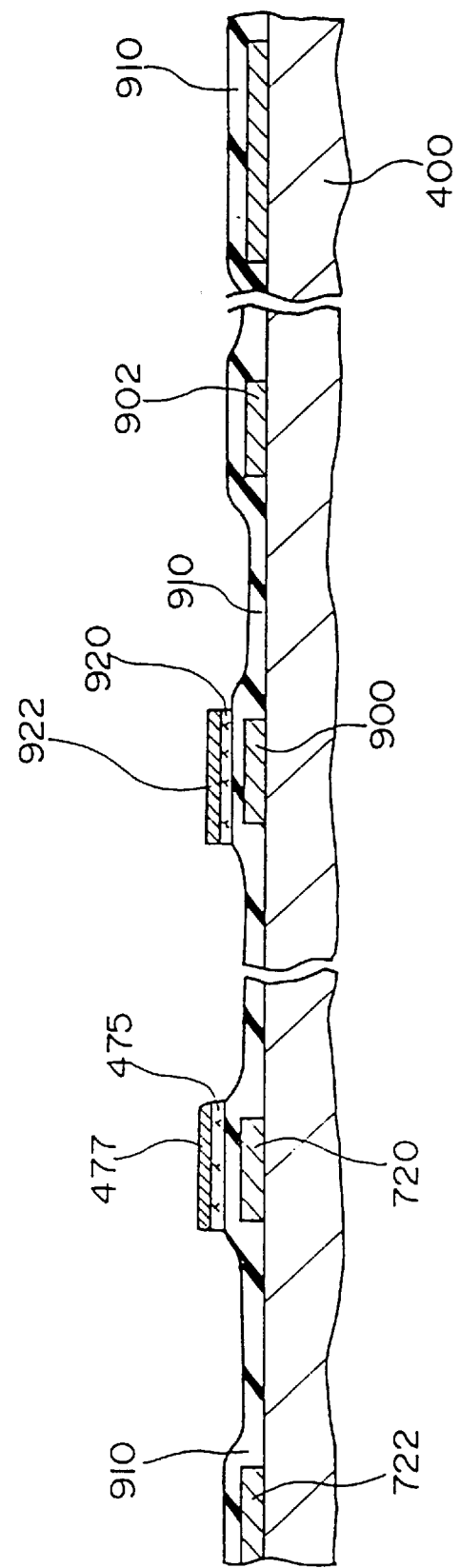

(2) Next, as shown in FIG. 20, continuous formation of the gate insulation film 910 formed from silicon nitride film $SiN_x$ and the like, formed by plasma CVD method, and genuine amorphous silicon film which does not include doped impurities, and the n type silicon film (ohmic layer) is accomplished. Continuing, patterning of the genuine amorphous silicon film and the n type silicon film (ohmic layer) is accomplished by means of dry etching in which utilization is made of $SF_6$ type etching gas.

By this means, formation of the genuine amorphous silicon layers 475 into islands, and n type silicon layers (ohmic layer) 477, and 922 is accomplished.

The thickness of the gate insulation film 910 is, for example, approximately 4000 Å, and the thickness of the genuine silicon layers 475 and 920 are, for example, approximately 3000 Å, whereas the thickness of the ohmic layers 477 and 922 are, for example, about 900 Å.

With regard to this process, characteristically, there is no formation of a contact hole relative to the gate insulation film. Furthermore, the coating process of the photo resist, the light exposure process, and the etching removal process comprising three processes become unnecessary, and the number of processes is abbreviated.

Figure 21:
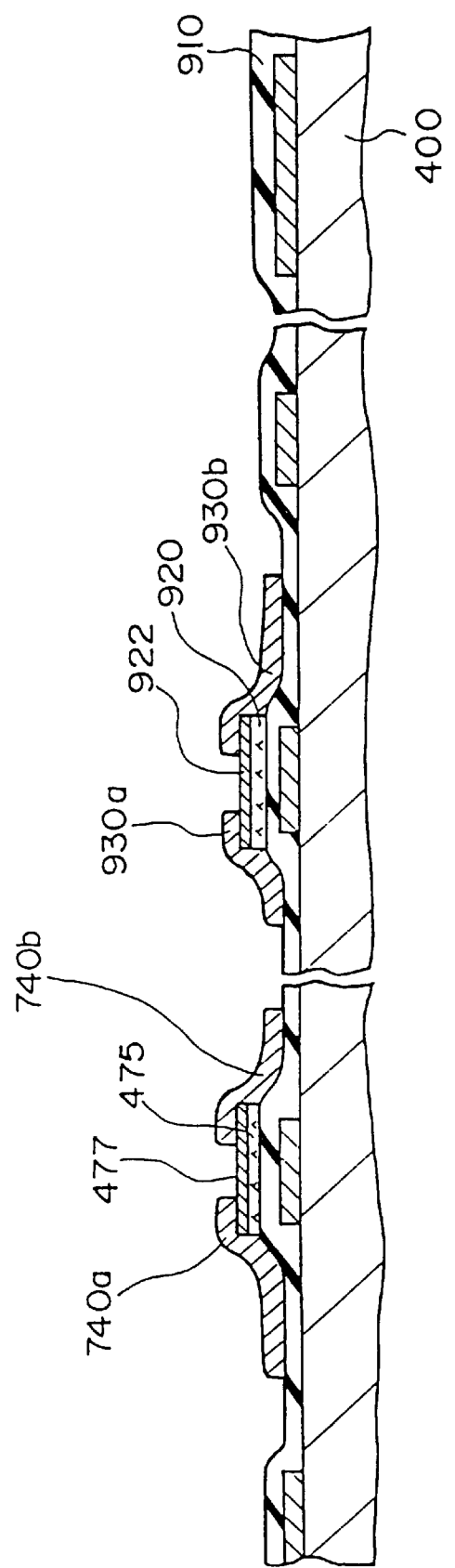

(3) Next, as shown in FIG. 21, the source/drain electrode layers 740a, 740b, 930a, and 930b which are approximately 1500 Å and which are formed from Cr (chrome) are formed by means of sputtering and photo etching.

(4) Continuing, separation of the source and drain, removing the ohmic layer 477 and 922 center portions by means of etching is accomplished using the source/drain electrode layers 740a, 740b, 930a, and 930b as a mask.

Figure 22:
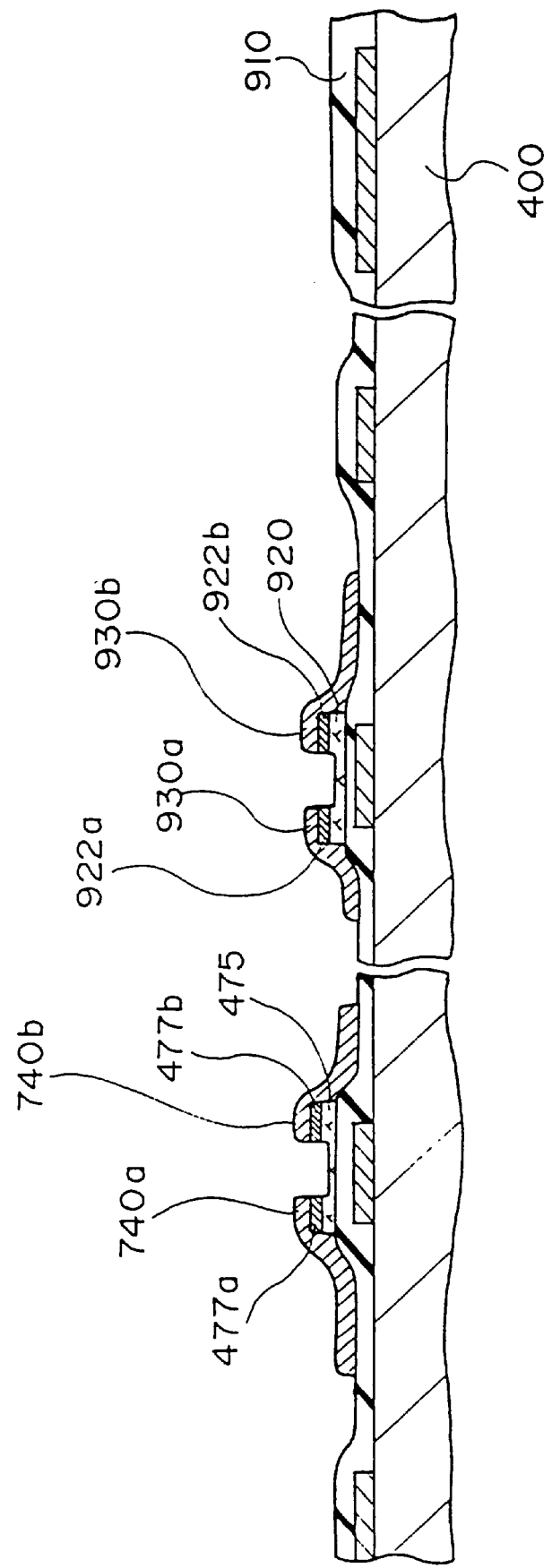

The source/drain electrode layer patterning shown in FIG. 21, and the source/drain separation etching shown in FIG. 22 are continuously accomplished within the same dry etching device chamber. In other words, initially, processing of the source/drain electrode layers 740a, 740b, 930a, and 930b is accomplished by means of $Cl_2$ type etching gas. Continuing, by switching the etching gas to the $SF_6$ type gas, etching of the center of the ohmic layers 477, and 922 is accomplished. In this manner, dry etching is continued in its use, thereby simplifying the manufacturing operation.

Figure 23:
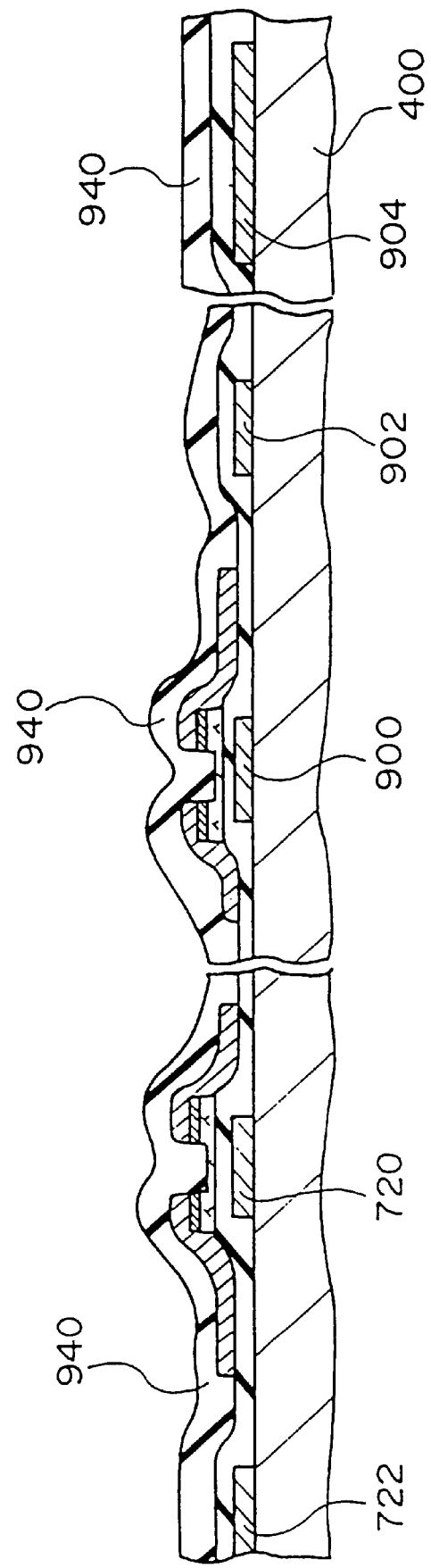

(5) Next, as shown in FIG. 23, the protective film 940 is formed using the plasma CVD method. This protective film is, for example, a silicon nitride film $SiN_x$ having a thickness of approximately 2000 Å.

Figure 24:
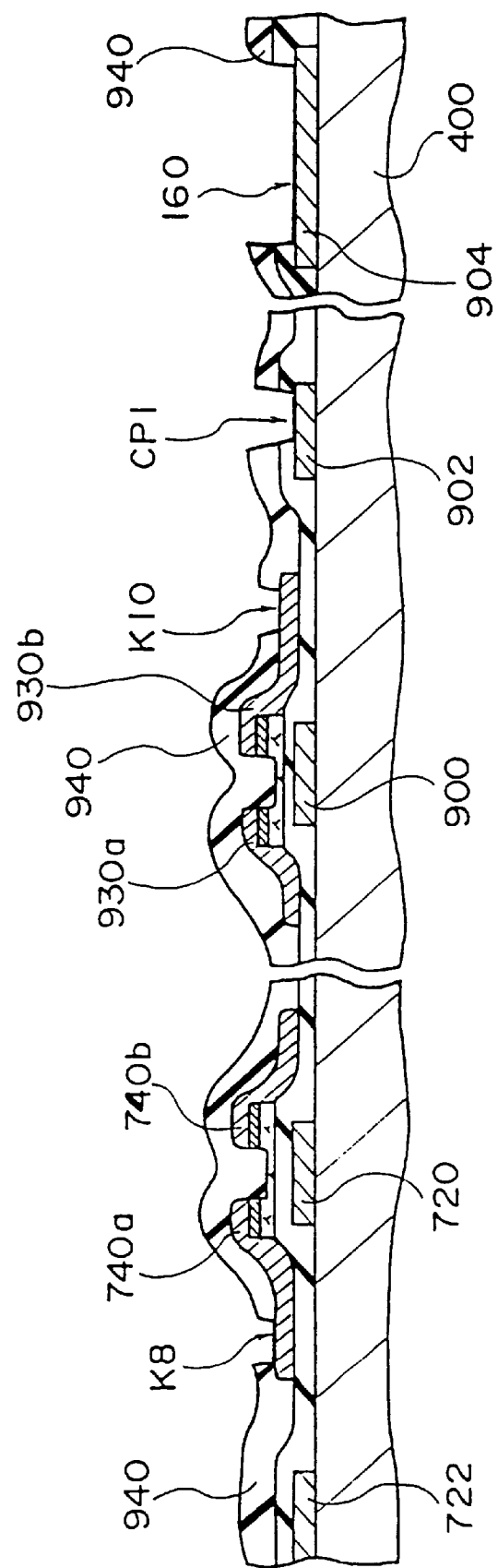

(6) Next, as shown in FIG. 24, the protective film 940 is selectively etched using the $SF_6$ type etching gas is accomplished. In other words, at the same time as forming the aperture 160 of the pad, formation of the contact hole CP1 and the contact hole K8 and K10 is accomplished.

The aperture 160 and the contact hole CP1 are apertures formed through the built up film of the gate insulation film 910 and the protective film 940, and the contact holes K8 and K10 are apertures which only pass through the protective film 940.

In this instance, the gate electrode material layers 902 and 904 respectively function as etching stoppers at the time of forming the contact hole CP1 and the aperture 160, and the source/drain electrodes 740a and 930b respectively function as etching stoppers at the time of forming the contact holes K8 and K10.

Figure 25:
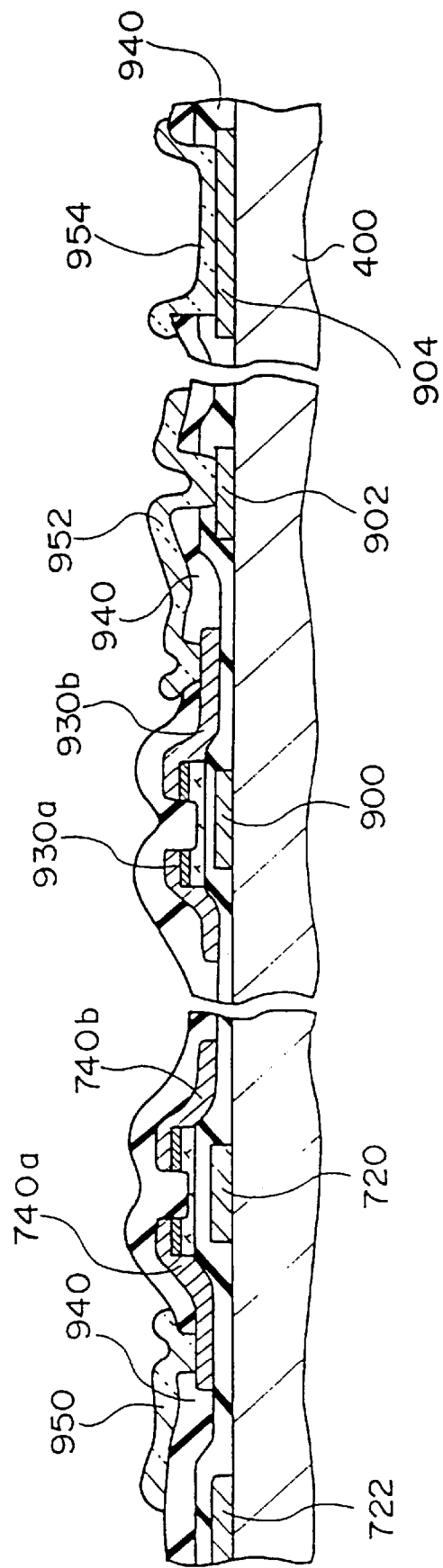

(7) Next, as shown in FIG. 25, the ITO (indium tin oxide) film is deposited with a thickness of approximately 500 Å utilizing a magnetron sputtering device), wherein etching is accomplished utilizing a compound liquid comprising Hcl/ $HNO_3/H_2O$, being processed into a specific pattern. By this means, the active matrix substrate is complete. In FIG. 25, the reference number 950 is a pixel electrode formed from ITO, the reference number 952 is wiring formed from ITO which composes a part of the protective diode, and reference number 954 is an electrode (pad) formed from an ITO for connecting the external terminal.

Since ITO having good step coverage is used as wiring, a good electrical connection can be assured. As the pixel electrode material, utilization can be made also of other transparent electrode materials having a high melting point, such as metallic oxides. For example, use may be made of such metallic oxides as $SnOx$ and $ZnOx$ and the like.

In addition, as is clear from FIG. 25, a protective film 940 necessarily passes between the ITO layers 950 and 952, and the source/drain electrodes 740a, 740b, 930a, and 930b. This means that in a wiring region (not shown in the diagram) on the substrate, the wiring layer formed from ITO and the source/drain electrode layer are assuredly electrically separated. Furthermore, there is no concern of shorting of two items being caused by foreign substances.

In addition, with this manufacturing method, since the ITO film is formed in the final process (FIG. 25), there is little concern relating to staining caused by ITO composites such as tin (Sn) and indium (In). In this manner, according to the manufacturing method of the present embodiment, the manufacturing process of an active matrix substrate can be abbreviated. Furthermore, it is possible to mount a thin film circuit having high reliability as an adequate countermeasure for static electricity.

Furthermore, in FIG. 25, direct connection of ITO film 952 and 954 to the gate electrode layer 902 and to the gate electrode material layer 904 is accomplished. However, it is also possible for connection to be accomplished through other materials through buffer layers such as molybdenum (MO), tantalum (Ta), and titan (Ti) and the like.

Next, an explanation is provided with regard to the process for assembling a liquid crystal display device using a completed active matrix substrate.

Figure 28:
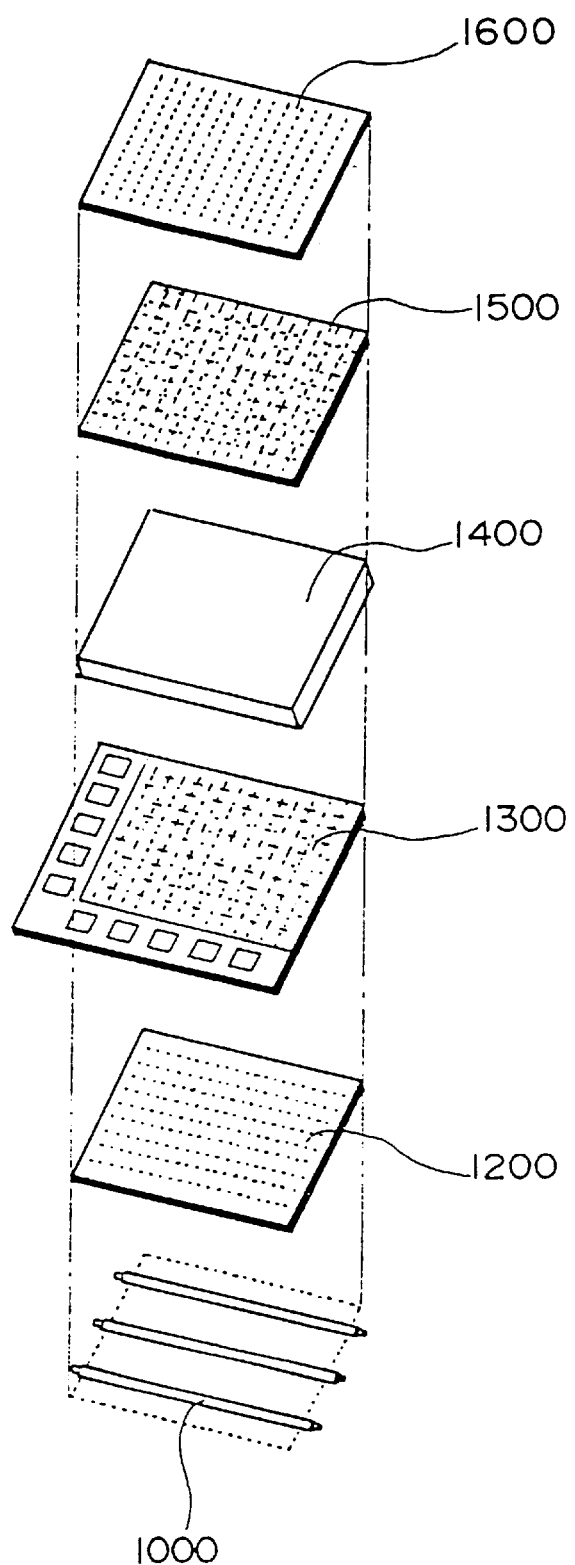
FIG. 28 is a diagram for explaining a summary of the entire construction of the liquid crystal display device of an active matrix type.

As shown in FIG. 28, emulation of the opposing substrate 1500 and the TFT substrate 1300 is accomplished, and, following the cell division process shown in FIG. 27, enclosure of the liquid crystal is accomplished. Next, the IC used for the drive is connected, and furthermore as shown in FIG. 28, the assembly process using polarized light plates 1200, and 1600 and the back light 1000 and the like is accomplished, thereby completing the active matrix liquid crystal display device.

Figure 26:
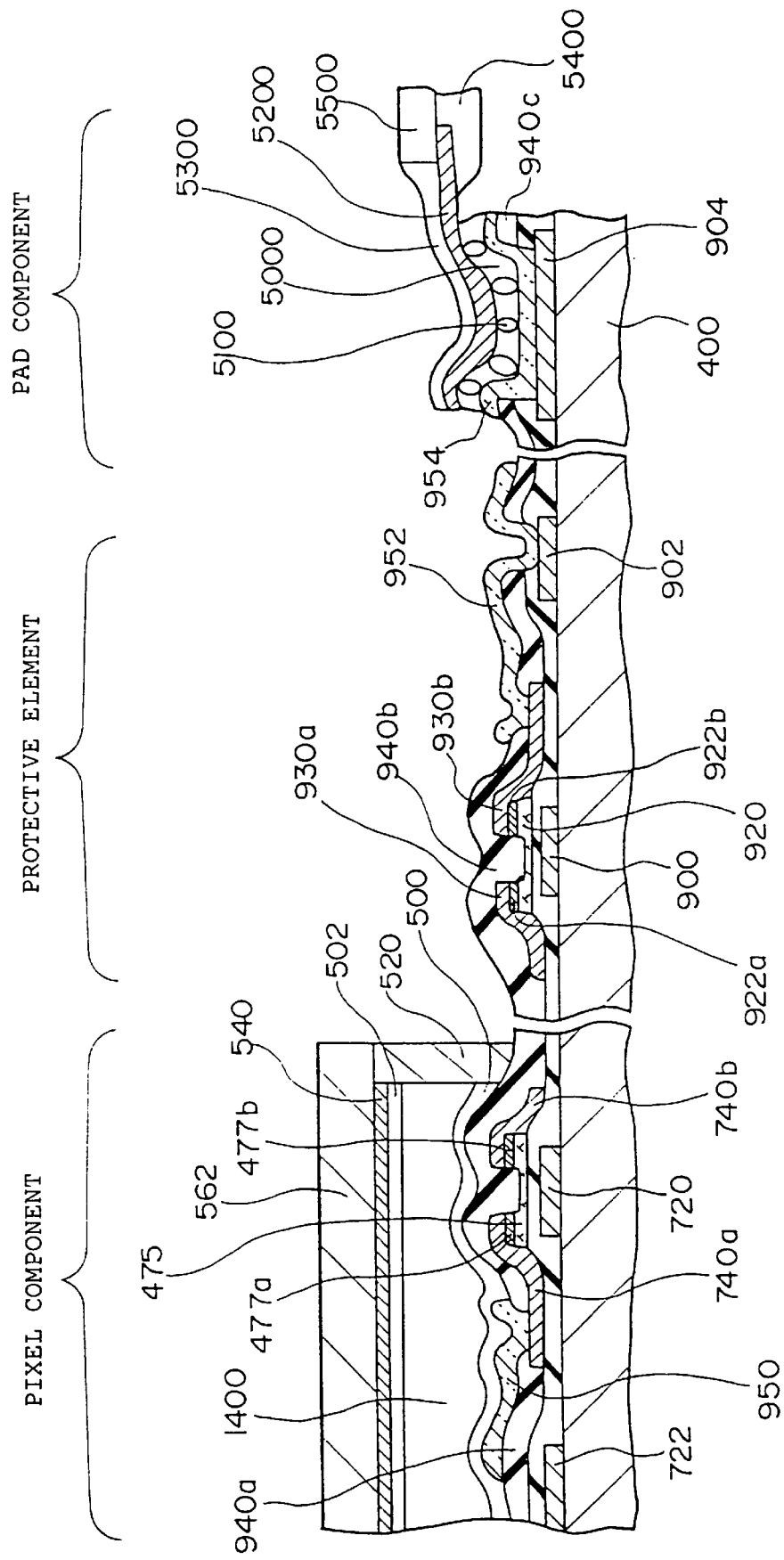
FIG. 26 is a diagram which shows the cross-sectional structure of the essential components of the liquid crystal display device in its assembled form utilizing the active matrix substrate of FIG. 25.

FIG. 26 is a cross-sectional diagram of the essential components of an active matrix liquid crystal display device. In FIG. 26, the same reference numbers are applied to the same locations as for the drawings shown in FIGS. 15 and 18.

In FIG. 26, regions are formed wherein the left side is an active matrix, and the center is a protective element (static electricity protective diode), and the right side is a pad. In the pad, an outer lead 5200 of the driver IC 5500 of the liquid crystal is connected through the anistropic conductive film 5000 on the electrode (pad) 954 formed from the ITO. The reference number 5100 is an electrically conductive granule, the reference 5300 is a film tape, and the reference number 5400 is a resin used for encapsulation.

In FIG. 26, adoption is made of the format (TAB) which uses a tape carrier as the method for connecting the driver-IC. However, other formats such as the COG (chip on glass) format may also be adopted.

The present invention is not limited to the above embodiment, and it is also possible to use an appropriate changed form as well where adoption is made of a positive stagger method TFT. In addition, as the pixel electrode material, utilization may also be made of other transparent electrode materials having a high melting point, such as metallic oxides, for the ITO. For example, utilization may be made of metallic oxides such as SnOx and ZnOx and the like. In this instance as well, the step coverage can withstand actual use.

If the liquid crystal display device of the present embodiment is used as a display device in a mechanism such as a personal computer, the value of the product is improved.

What is claimed is:

1. A method of manufacturing a thin film element comprising the steps of:

(A) forming a gate electrode layer, and a gate electrode material layer on a substrate having the same material as the gate electrode layer;

(B) forming a gate insulation film on said gate electrode layer and gate electrode material layer;

(C) forming a channel layer and an ohmic contact layer on said gate insulation film that overlaps horizontally with said gate electrode layer;

(D) forming a source electrode layer and a drain electrode layer that are connected to said ohmic contact layer;

(E) removing said ohmic contact layer from a region between said source electrode layer and the drain electrode layer by etching;

(F) forming a protective film for covering said source electrode layer said drain electrode layer and said gate electrode material layer;

(G) forming a first aperture wherein a part of said gate insulation film and the overlapping layer of the protective film and said gate electrode material layer are selectively etched for exposing a portion of a surface of one of the gate electrode layer and the gate electrode material layer and at the same times, forming a second aperture wherein a portion of the protective film on the source electrode layer and the drain electrode layer are selectively etched for exposing a portion of a surface of one of the source electrode layer and the drain electrode layer; and (H) connecting an electrically conductive material layer through said first aperture and said second aperture to at least one of the gate electrode layer, the gate electrode material layer, the source electrode layer, and/or the drain electrode layer.

2. The method of manufacturing a thin film element in claim 1, wherein said first aperture formed in said step (G) is one of a contact aperture for connecting a wiring to said gate electrode material layer, and an aperture for connecting an external terminal to said gate electrode material layer.

3. The method of manufacturing a thin film element in claim 1, wherein said electrically conductive material is formed of ITO (indium tin oxide).

4. An active matrix substrate comprising:

a thin film transistor (TFT) connected to a scanning line, a signal line arranged in a matrix state, and a pixel electrode to compose pixel components;

protective means for preventing static electricity destruction using thin film transistors established between at least one of said scanning line and said signal line, or a region electrically equivalent to the at least one of said scanning line and said signal line, and a common electric potential region, said protective means for preventing electrostatic destruction includes a diode wherein a gate electrode layer in the thin film transistor and a source/drain electrode layer are connected; and a first aperture formed by selectively removing an insulation layer on said gate electrode layer and a second aperture formed in a same manufacturing process by selectively removing an insulating layer on said source/drain electrode layer, said gate electrode layer and said source/drain electrode layer electrically connected via said first aperture and said second aperture by an electrically conductive material layer composed of the same material as said pixel electrode.

5. The active matrix substrate in claim 4, wherein said first aperture passes through the overlapping film of the first insulation film on the gate electrode material layer and passes through the second insulation film on the first insulation film, and the second aperture passes through only the second insulation film on the source/drain electrode layer.

6. The active matrix substrate in claim 4, wherein said pixel electrode and the electrically conductive material layer are formed from ITO (indium tin oxide) film.

7. The active matrix substrate in claim 4, wherein a region electrically equivalent to at least one of the scanning line and the signal line is an electrode for connecting the external terminal, and one of a common electric potential line which applies a standard potential that becomes the standard potential at a time of driving the liquid crystal using alternate current, and a joint electric potential line for commonly connecting the electrode to make the electrode and the one of the common electric potential line and the joint electric potential line the same electric potential.

8. The active matrix substrate in claim 7, wherein the protective means for preventing electrostatic destruction is provided both between the electrode for connecting the external terminal and the common electric potential line and between the electrode for connecting the external terminal and the joint electric potential line.

9. The active matrix substrate in claim 4, wherein said protective means for preventing static electricity destruction includes a bi-directional diode for commonly connecting a first diode anode and a second diode cathode, for commonly connecting a first diode cathode and a second diode anode.

10. A liquid crystal display device using the active matrix substrate described in claim 4.

11. A method of manufacturing an active matrix substrate comprising the steps of:

(A) forming a gate electrode layer, and a gate electrode material layer on a substrate having the same material as the gate electrode layer;

(B) forming a gate insulation film on said gate electrode layer and gate electrode material layer;

(C) forming a channel layer having a gate electrode layer as a plane surface on the gate insulation film;

(D) forming a source/drain electrode layer connected to an ohmic contact layer and for forming a source/drain electrode material layer from the same material as the source/drain electrode layer in a predetermined region on said insulation film;

(E) forming a protective film for covering said source electrode layer, said drain electrode layer and said gate electrode material layer;

(F) forming a first aperture wherein a part of said gate insulation film and the overlapping layer of the protective film on the gate electrode layer and said gate electrode material layer are selectively etched for exposing a portion of a surface of one of the gate electrode layer and the gate electrode material layer and at the same times, forming a second aperture wherein a portion of the protective film on the source/drain electrode layer and source/drain electrode material layer are selectively etched for exposing a portion of a surface of one of the source/drain electrode layer and the source/drain electrode material layer; and (G) connecting an electrically conductive material layer to at least one of the gate electrode layer, the gate electrode material layer, the source/drain electrode layer and the source/drain electrode material layer through said first aperture and said second aperture.

12. The method of manufacturing an active matrix substrate in claim 11, wherein:

a thin film transistor (TFT) is connected to a scanning line and a signal line;

a pixel electrode is connected to the thin film transistor; and a diode for preventing electrostatic destruction constructed for connecting a thin film transistor gate electrode layer and the source/drain electrode layer, on the active matrix substrate.

13. The method of manufacturing an active matrix substrate in claim 12, wherein the layer formed from the same layer as the pixel electrode is the electrically conductive material layer.

14. The method of manufacturing an active matrix substrate in claim 11, wherein ITO (Indium Tin Oxide) is the electrically conductive material layer.

15. A method for preventing electrostatic destruction of active elements in an active matrix liquid crystal display device, comprising the steps of:

forming a pixel part including a thin film transistor connected to a scanning line and a signal line arranged in a matrix, and a pixel electrode connected to one end of the thin film transistor;

providing protective means for preventing electrostatic destruction, including a diode having a gate electrode layer in the thin film transistor connected to a source/drain electrode layer; and connecting the protective means for preventing static electricity destruction between at least one of said scanning line, said signal line, a member electrically equivalent to at least one of said scanning line and said signal line, and a common electric potential line.

* * * * *